United States Patent
Namiki

(10) Patent No.: US 6,507,795 B2
(45) Date of Patent: *Jan. 14, 2003

(54) ELECTROMAGNETIC WAVE ANALYZER AND COMPUTER-READABLE MEDIUM STORING PROGRAMS FOR ELECTROMAGNETIC WAVE ANALYSIS

(75) Inventor: Takefumi Namiki, Kawasaki (JP)

(73) Assignee: Fujitsu Limited, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/262,919

(22) Filed: Mar. 5, 1999

(65) Prior Publication Data

US 2002/0099510 A1 Jul. 25, 2002

(30) Foreign Application Priority Data

Jun. 12, 1998 (JP) ............................................ 10-164577

(51) Int. Cl.⁷ ............................................. G01R 13/00
(52) U.S. Cl. ............................. 702/66; 702/64; 702/127
(58) Field of Search ............................. 702/64, 65, 66, 702/67, 71–73; 395/500.01

(56) References Cited

U.S. PATENT DOCUMENTS 5,495,429 A * 2/1996 Craven et al. ............... 702/127
5,621,649 A * 4/1997 Iwata et al. .................... 702/64
5,703,787 A * 12/1997 Namiki ......................... 364/487

OTHER PUBLICATIONS

Rekanos, I.T.; Tsiboukis, T.D., "A finite element–based technique for microwave imaging of two–dimensional objects" Instrumentation and Measurement, IEEE Transactions on, Vol. 49 Issue: 2000 pp.: 234–239.*

T. Namiki, "Numerical Formulation and Fundamental Study of Alternating Direction Implicit Finite Difference Time Domain Method", Mar. 6, 1998, pp. 1–5.

"Implicit Three–Dimensional Finite Differencing of Maxwell's Equations" by Richard Holland, Electro Magnetic Applications, Inc., Albuquerque, New Mexico and Computer Sciences Corporation, Albuquerque, New Mexico (1984).

* cited by examiner

Primary Examiner—John S. Hilten
Assistant Examiner—John Le
(74) Attorney, Agent, or Firm—Staas & Halsey LLP

(57) ABSTRACT

An electromagnetic wave analyzer which numerically analyzes the behavior of electromagnetic waves at a higher computation speed, even when the object model has fine geometrical features. An analysis command input unit produces a command to initiate a simulation. Upon receipt of this command, an analyzing unit starts to calculate electromagnetic field components with an alternating direction implicit FD-TD method. The analyzing unit divides each time step into a first-half and second-half stages and alternately executes their respective operations.

13 Claims, 8 Drawing Sheets

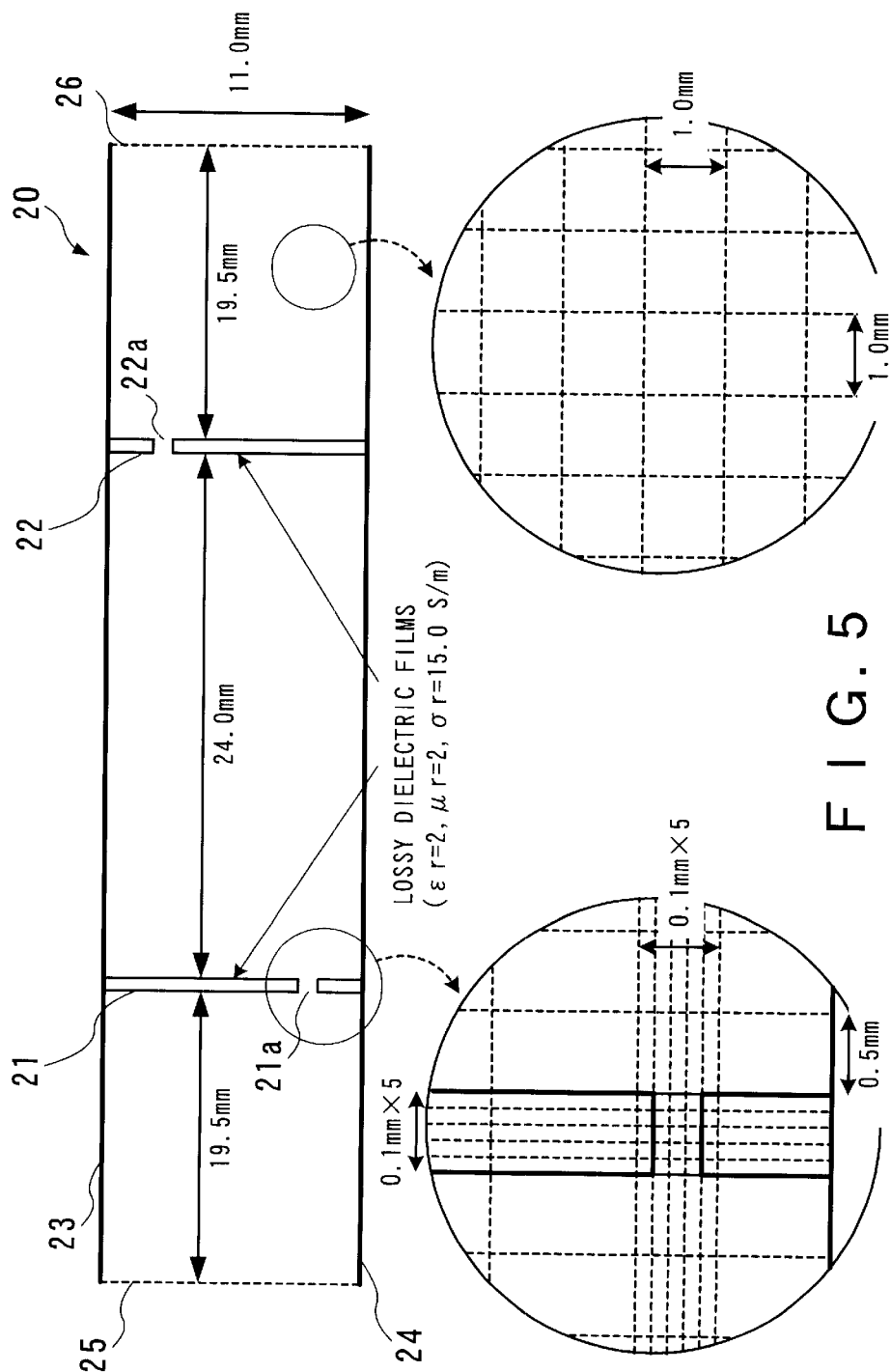
F I G. 5

ELECTROMAGNETIC WAVE ANALYZER AND COMPUTER-READABLE MEDIUM STORING PROGRAMS FOR ELECTROMAGNETIC WAVE ANALYSIS

BACKGROUND OF THE INVENTION

1. Field of the Invention

The present invention relates to an electromagnetic wave analyzer which analyzes the behavior of electromagnetic waves by using computer simulation techniques, and also to a computer-readable medium for storing electromagnetic wave analyzer programs. More particularly, the present invention relates to an electromagnetic wave analyzer which uses finite-difference time-domain (FD-TD) algorithms to numerically solve electromagnetic wave problems, and also to a computer readable medium for storing computer programs designed for that purpose.

2. Description of the Related Art

Today's computational electromagnetics exploits the finite-difference time-domain (FD-TD) method as a technique to analyze the transitional behavior of electromagnetic waves by using a computer for numerical calculation. The FD-TD algorithm, which solves the Maxwell's equations in time and spatial domains with difference methods, is actually used in many different situations because of its wide scope of applications. Conventionally, FD-TD solutions are numerically obtained through explicit methods as described below. For simplicity, consider the following one-dimensional parabolic partial differential equation (1).

$$\frac{\partial f}{\partial t} = \frac{\partial^2 f}{\partial x^2} \quad (1)$$

$$f(t,x) = f(_n\Delta_t, _i\Delta_x) = f_i^n \quad (2)$$

where n is the number of time steps that have elapsed from the beginning of computation, $\Delta_t$ is the temporal discretization interval (i.e., time step size), i is the grid coordinate number representing a specific point in the one-dimensional space, and $\Delta_x$ is the spatial discretization interval (i.e., space increment or cell size). The equation (2) indicates that f is a function of time t and position x, where t and x are discretized as $_n\Delta_t$ and $_i\Delta_x$, respectively. To yield a solution by using an explicit method, the above differential equation is approximated to the following forward-difference expression with respect to its time derivative.

$$\frac{f_i^{n+1} - f_i^n}{\Delta t} = \frac{f_{i+1}^n - 2f_i^n + f_{i-1}^n}{\Delta x^2} \quad (3)$$

Let $r = \Delta_t/\Delta_x^2$, then this equation (3) can be rewritten as follows.

$$f_i^{n+1} = rf_{i+1}^n + (1-2r)f_i^n + rf_{i-1}^n \quad (4)$$

Note that, when a solution at time $_n\Delta_t$ is given, this equation (4) immediately gives the next solution at time $(n+1)\Delta_t$. Numerical solvers of this kind are referred to as explicit methods.

The explicit difference method of the equation (4), however, must satisfy the following condition for stability to make sure that the solution will converge toward a final solution.

$$r = \frac{\Delta t}{\Delta x^2} \leq \frac{1}{2} \quad (5)$$

Furthermore, to avoid numerical instability in FD-TD computation, the following condition should be satisfied, which is known as the Courant, Friedrich, and Levy (CFL) condition, or Courant condition.

$$\Delta t \leq \frac{1}{v\sqrt{\left(\frac{1}{\Delta x_{min}}\right)^2 + \left(\frac{1}{\Delta y_{min}}\right)^2 + \left(\frac{1}{\Delta z_{min}}\right)^2}} \quad (6)$$

Detailed discussion on the CFL condition in FD-TD is found in the literature, A. Taflove, "Computational Electrodynamics," MA, Artech House Inc., 1995. The equation (6) is known as the Courant condition for three-dimensional wave analysis, where v is the propagation rate of electromagnetic waves, and $\Delta_{x_{min}}$, $\Delta_{y_{min}}$, and $\Delta_{z_{min}}$ are minimum values of spatial discretization intervals in the x, y, and z directions, respectively.

Because of the constraints discussed above, the maximum time step size in explicit methods is dependent on the minimum cell size. That is, the time step size must be reduced when analyzing an object having fine geometrical features, resulting in an increased number of simulation steps to be iterated. This would cause a serious problem of long simulation time, particularly when calculating a time response for an extended period.

Partial differential equations can be solved not only with explicit methods, but also with implicit methods. For example, a backward difference approximation to the one-dimensional parabolic partial differential equation (1) is as follows.

$$\frac{f_i^{n+1} - f_i^n}{\Delta t} = \frac{f_{i+1}^{n+1} - 2f_i^{n+1} + f_{i-1}^{n+1}}{\Delta x^2} \quad (7)$$

Similar to the case of explicit methods mentioned above, this difference equation (7) can be rearranged as follows, by letting $r = \Delta_t/\Delta_x^2$.

$$-rf_{i+1}^{n+1} + (1+2r)f_i^{n+1} - rf_{i-1}^{n+1} \times f_i^n \quad (8)$$

This equation (8) is an implicit expression of the problem to be solved. Unlike the explicit methods, the numerical stability is guaranteed when solving this implicit expression. In the implicit method, however, it is necessary to solve the following set of simultaneous equations in order to obtain a series of $fi^{n+1}$.

$$\begin{pmatrix} b_1 & c_1 & & & & \\ a_2 & b_2 & c_2 & & 0 & \\ & & \ddots & & & \\ & & & \ddots & & \\ & 0 & & a_{imax-1} & b_{imax-1} & c_{imax-1} \\ & & & & a_{imax} & b_{imax} \end{pmatrix} \begin{pmatrix} f_1^{n+1} \\ f_2^{n+1} \\ \vdots \\ \vdots \\ f_{imax-1}^{n+1} \\ f_{imax}^{n+1} \end{pmatrix} = \begin{pmatrix} f_1^n \\ f_2^n \\ \vdots \\ \vdots \\ f_{imax-1}^n \\ f_{imax}^n \end{pmatrix} \quad (9)$$

where $a_i$ is the invariable part (−r) of the third term of the left-hand side of equation (8) when i=1, 2, . . . imax, $b_i$ is the invariable part (1+2r) of the second term of the left-hand side of equation (8) when i=1, 2, . . . imax, and $c_i$ is the invariable part (−r) of the first term of the left-hand side of equation (8) when i=1, 2, . . . imax.

To analyze the transient behavior of electromagnetic waves, it is required to solve a partial differential equation in the space of at least two dimensions. Special care must be taken when solving this kind of problems by use of implicit methods. Consider here that the following two-dimensional partial differential equation is given.

$$\frac{\partial f}{\partial t} = \frac{\partial^2 f}{\partial x^2} + \frac{\partial^2 f}{\partial y^2} \qquad (10)$$

To solve this equation (10) with, for example, the Crank-Nicolson method, its time derivative term is approximated as follows.

$$\frac{f_{i,j}^{n+1} - f_{i,j}^{n}}{\Delta t} = \frac{1}{2}\left\{\frac{f_{i+1,j}^{n} - 2f_{i,j}^{n} + f_{i-1,j}^{n}}{\Delta x^2} + \frac{f_{i,j+1}^{n} - 2f_{i,j}^{n} + f_{i,j-1}^{n}}{\Delta y^2}\right\} + \frac{1}{2}\left\{\frac{f_{i+1,j}^{n+1} - 2f_{i,j}^{n+1} + f_{i-1,j}^{n+1}}{\Delta x^2} + \frac{f_{i,j+1}^{n+1} - 2f_{i,j}^{n+1} + f_{i,j-1}^{n+1}}{\Delta y^2}\right\} \qquad (11)$$

The solution of this equation (11) can be reached by solving a set of simultaneous linear equations having as many unknowns as $(Nx-1)\times(Ny-1)$, where Nx and Ny are the numbers of meshes in the x-axis and y-axis directions, respectively. This computation makes extreme demands on oth computer memory and processing power, even when fine meshing is required. The result is that implicit methods are as time-consuming as explicit methods, even when the simulation model has a fine geometrical feature that needs a smaller cell size.

SUMMARY OF THE INVENTION

Taking the above into consideration, an object of the present invention is to provide an electromagnetic wave analyzer which analyzes electromagnetic waves at a higher computation speed even when the object model has a fine geometrical feature.

To accomplish the above object, according to the present invention, there is provided an electromagnetic wave analyzer for analyzing electromagnetic wave propagation by solving Maxwell's equations in both time and spatial domains. This analyzer comprises an analysis command input unit which produces a command to initiate a simulation after establishing initial conditions and parameters necessary therefor. Here, the initial conditions and parameters include a temporal discretization interval $\Delta_t$. The analyzer also comprises an analyzing unit which is responsive to the command from the analysis command input unit. This analyzing unit analyzes the behavior of an electromagnetic wave with an alternating direction implicit finite-difference time-domain method which refers to a state of the electromagnetic wave at a first time point to calculate a new state of the electromagnetic wave at a second time point being $\Delta_t$ after the first time point.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 5 is a diagram which shows a first simulation model;

DESCRIPTION OF THE PREFERRED EMBODIMENTS

Embodiments of the present invention will be described below with reference to the accompanying drawings. The present invention proposes an electromagnetic wave analyzer which uses an alternating direction implicit finite-difference time-domain (ADI FD-TD) method to analyze the behavior of electromagnetic waves at a high computation speed with guaranteed numerical stability.

Figure 1:
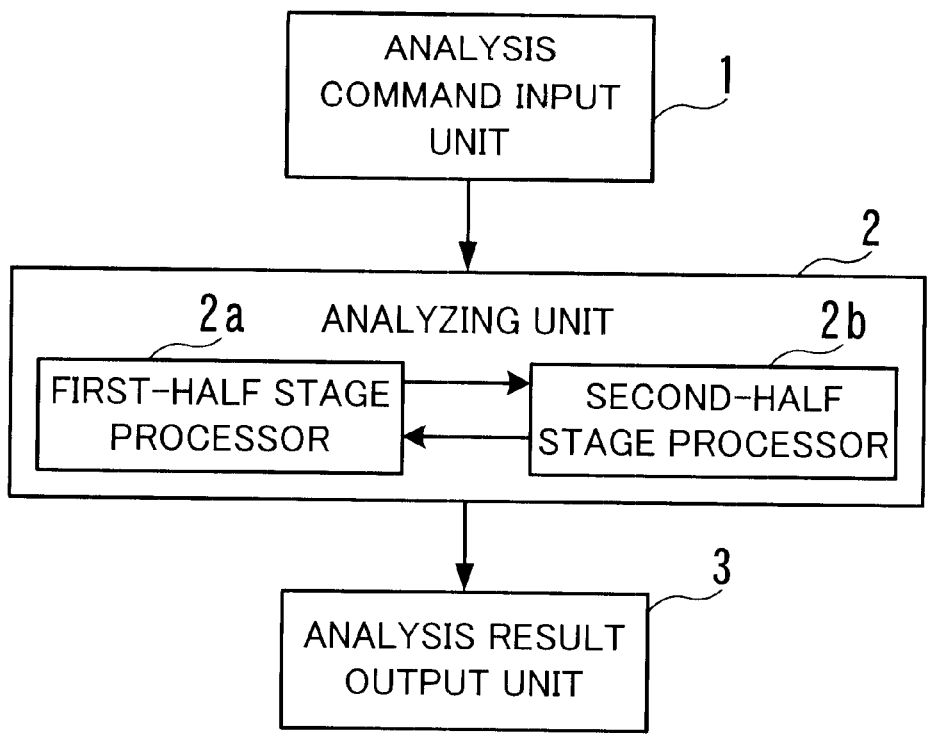
FIG. 1 is a conceptual view of the present invention.

FIG. 1 shows a conceptual view of the present invention. An analysis command input unit 1 provides an analysis command to this analyzer system, specifying initial parameters and absorbing boundary conditions necessary for a specific session of electromagnetic wave analysis. Receiving this analysis command from the analysis command input unit 1, an analyzing unit 2 numerically analyzes the propagation of a two-dimensional transverse electric (TE) wave with an alternating direction implicit finite-difference time-domain (ADI FD-TD) method. Here, the term "TE wave" refers to an electromagnetic wave that is expressed by the following equations.

$$\varepsilon \frac{\partial E_x}{\partial t} = \frac{\partial H_z}{\partial y} \qquad (12)$$

$$\varepsilon \frac{\partial E_y}{\partial t} = -\frac{\partial H_z}{\partial x} \qquad (13)$$

$$\mu \frac{\partial H_z}{\partial t} = \frac{\partial E_x}{\partial y} - \frac{\partial E_y}{\partial x} \qquad (14)$$

In the ADI FD-TD method, each time step is divided into a first and second halves, and the analyzer alternately performs computation of these first-half and second-half phases, or stages. Recall, for example, the two-dimensional parabolic partial differential equation (10) mentioned earlier. To solve the equation (10) with an ADI scheme, its time derivative is approximated in two-stage form as follows.

$$\frac{f_{i,j}^{n+1/2} - f_{i,j}^{n}}{\Delta t} = \frac{1}{2}\left\{\frac{f_{i+1,j}^{n+1/2} - 2f_{i,j}^{n+1/2} + f_{i-1,j}^{n+1/2}}{\Delta x^2} + \frac{f_{i,j+1}^{n} - 2f_{i,j}^{n} + f_{i,j-1}^{n}}{\Delta y^2}\right\} \qquad (15)$$

$$\frac{f_{i,j}^{n+1} - f_{i,j}^{n+1/2}}{\Delta t} = \frac{1}{2}\left\{\frac{f_{i+1,j}^{n+1/2} - 2f_{i,j}^{n+1/2} + f_{i-1,j}^{n+1/2}}{\Delta x^2} + \frac{f_{i,j+1}^{n+1} - 2f_{i,j}^{n+1} + f_{i,j-1}^{n+1}}{\Delta y^2}\right\} \qquad (16)$$

where $\Delta_t$ is time step size, $\Delta_x$ and $\Delta_y$ are space increments in the x-axis and y-axis directions, respectively.

Here, the equation (15) represents the first-half stage process. It should be noted that the time derivative on the left-hand side is interpreted as a backward difference approximation with respect to the x-direction derivative of f at time step n+1/2, and also as a forward difference approximation with respect to the y-direction derivative of f at time step n. Concerning the other equation (16) representing the second-half stage, its time derivative on the left-hand side is interpreted as a forward difference approximation with respect to the x-direction derivative of f at time step n+2/1, and also as a backward difference approximation with respect to the y-direction derivative of f at time step n+1.

The first-half stage processor 2a is responsible for the first-half stage of computation, while the second-half phase processor 2b the second-half stage of computation. Although the time step size $\Delta_t$ is defined as the unit of temporal discretization, the time axis is actually advanced by half a step, or $\Delta_t/2$, for each of the first-half stage and second-half stage processes.

When electromagnetic field data at time $n\Delta_t$ is given, the first-half stage processor 2a calculates electromagnetic field components at time $(n+1/2)\Delta_t$, where n is the time step number which is counted up from the beginning of simulation (n=0, 1, 2, . . . ). At this stage, the first-half stage processor 2a calculates x-direction electric field components $Ex^{n+1/2}$ at time $(n+1/2)\Delta_t$ with an explicit method, while computing y-direction electric field components $Ey^{n+1/2}$ and z-direction magnetic field components $Hz^{n+1/2}$ at time $(n+1/2)\Delta_t$ with an implicit method. The first-half stage processor 2a passes those computational results to the second-half stage processor 2b.

When the electromagnetic field values at time $(n+1/2)\Delta_t$ are received from the first-half stage processor 2a, the second-half stage processor 2b calculates those at time $(n+1)\Delta_t$. At this stage, the second-half stage processor 2b calculates y-direction electric field components $Ey^{n+1}$ at time $(n+1)\Delta_t$ with an explicit method, while computing x-direction electric field components $Ex^{n+1}$ and z-direction magnetic field components $Hz^{n+1/2}$ at time $(n+1)\Delta_t$ with an implicit method. The second-half stage processor 2b passes those computational results back to the first-half stage processor 2a for the next iteration. The final outcome of the analyzing unit 2 is supplied to an analysis result output unit 3 for data output operation.

The following section will describe how the analyzing unit 2 calculates a new state of the electromagnetic wave at time $(n+1)\Delta_t$ when that at time $n\Delta_t$ is given.

Figure 2:
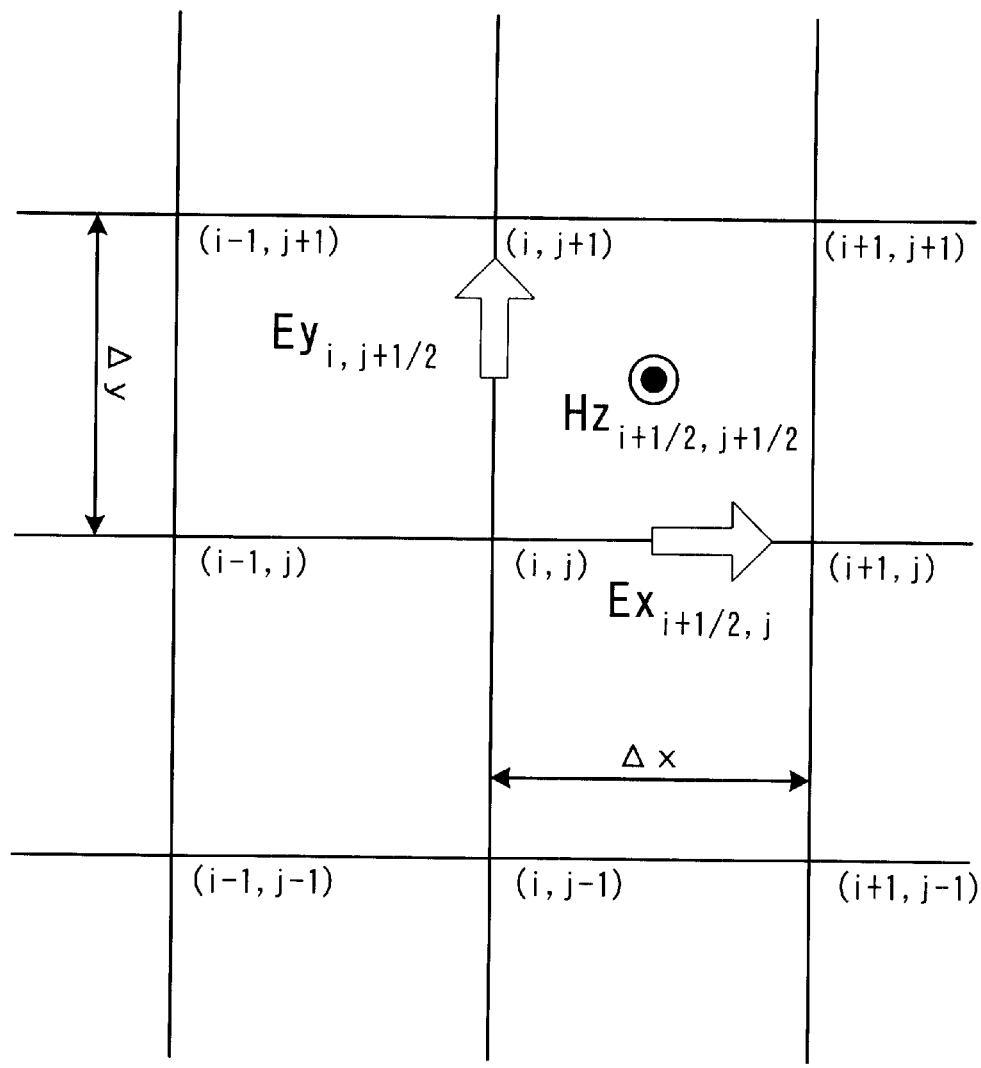
FIG. 2 is an enlarged view of meshes.
Figure 2:
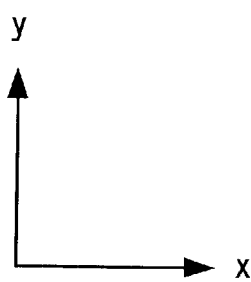

The computational domain is first divided into a plurality of rectangular regions, or meshes. More specifically, consider that a given two-dimensional domain is divided into (imax×jmax) meshes in the x-axis and y-axis directions, respectively. FIG. 2 is an enlarged view of such meshes. The position of each grid point is represented by a pair of integers (i, j), where i and j are grid coordinate numbers in the x-axis and y-axis directions, respectively. Further, the coordinate number (i+1/2) means the midpoint between (i) and (i+1).

Here, consider a two-dimensional TE wave in a region around a grid point (i, j). With difference methods, the analyzing unit 2 calculates how the following quantities will vary with time:

x-direction electric field component Ex at space point (i+1/2, j),
y-direction electric field component Ey at space point (i, j+1/2), and
z-direction magnetic field component Hz at space point (i+1/2, j+1/2).

As briefly described in earlier section, the proposed ADI FD-TD process, which solves Maxwell's equations in a given spatio-temporal domain, actually consists of two phases of computational operations, namely, the first-half and second-half stages. More specifically, in the first-half stage, the time derivative of Ex is approximated with a forward differencing technique as shown in equation (17), while the time derivative of Ey with a backward differencing technique as shown in equation (18). Further, as shown in equation (19), the time derivative of Hz is approximated by using both types of differencing techniques, i.e., forward differencing with respect to Ex and backward differencing with respect to Ey. That is, the state of TE wave at time $(n+1/2)\Delta_t$ is expressed by the following equations.

$$Ex_{i+1/2,j}^{n+1/2} = Ex_{i+1/2,j}^n + \left(\frac{\Delta_t}{2\varepsilon\Delta_y}\right)\{Hz_{i+1/2,j+1/2}^n - Hz_{i+1/2,j-1/2}^n\} \quad (17)$$

$$Ey_{i,j+1/2}^{n+1/2} = Ey_{i,j+1/2}^n - \left(\frac{\Delta_t}{2\varepsilon\Delta_x}\right)\{Hz_{i+1/2,j+1/2}^{n+1/2} - Hz_{i-1/2,j+1/2}^{n+1/2}\} \quad (18)$$

$$Hz_{i+1/2,j+1/2}^{n+1/2} = Hz_{i+1/2,j+1/2}^n + \quad (19)$$
$$\left(\frac{\Delta_t}{2\mu\Delta_y}\right)\{Ex_{i+1/2,j+1}^n - Ex_{i+1/2,j}^n\} - \left(\frac{\Delta_t}{2\mu\Delta_x}\right)\{Ey_{i+1,j+1/2}^{n+1/2} - Ey_{i,j+1/2}^{n+1/2}\}$$

where the superscript affixed to each E-field or H-field term represents its simulation time step, the subscript of each E-field or H-field term represents its grid position within the meshed computational domain, and symbols $\varepsilon$ and $\mu$ denote the permittivity and permeability of an object placed in the computational domain, respectively.

Notice that the first equation (17) is an explicit expression, while the other equations (18) and (19) are implicit expressions. That is, the x-direction electric field component $Ex^{n+1/2}$ at time $(n+1/2)\Delta_t$ can be obtained by using an explicit method, because the time derivative of Ex is approximated by forward differencing in the first-half stage of computation. In contrast to this, an implicit method should be employed to calculate the y-direction electric field component $Ey^{n+1/2}$ at time $(n+1/2)\Delta_t$, because the time derivative of By is approximated by backward differencing in the first-half stage of computation. Further, since the time derivative of Hz is approximated by backward differencing with respect to Ey, an implicit method should be used to obtain the z-direction magnetic field component $Hz^{n+1/2}$ at time $(n+1/2)\Delta_t$.

On the other hand, in the second-half stage of computation, the analyzing unit 2 calculates the state of the TE wave of interest at time $(n+1)\Delta_t$ by approximating the time derivative of Ex with a backward differencing technique as shown in equation (20), and the time derivative of Ey with a forward differencing technique as shown in equation (21). Further, as shown in equation (22), the time derivative of Hz is approximated by backward differencing with respect to Ex and by forward differencing with respect to Ey. That is, the TE wave at time $(n+1)\Delta_t$ is expressed as:

$$Ex_{i+1/2,j}^{n+1} = Ex_{i+1/2,j}^{n+1/2} + \left(\frac{\Delta_t}{2\varepsilon\Delta_y}\right)\{Hz_{i+1/2,j+1/2}^{n+1} - Hz_{i+1/2,j-1/2}^{n+1}\} \quad (20)$$

$$Ey_{i,j+1/2}^{n+1} = Ey_{i,j+1/2}^{n+1/2} - \left(\frac{\Delta_t}{2\varepsilon\Delta_x}\right)\{Hz_{i+1/2,j+1/2}^{n+1/2} - Hz_{i-1/2,j+1/2}^{n+1/2}\} \quad (21)$$

$$Hz_{i+1/2,j+1/2}^{n+1} = Hz_{i+1/2,j+1/2}^{n+1/2} + \quad (22)$$
$$\left(\frac{\Delta_t}{2\mu\Delta_y}\right)\{Ex_{i+1/2,j+1}^{n+1} - Ex_{i+1/2,j}^{n+1}\} - \left(\frac{\Delta_t}{2\mu\Delta_x}\right)\{Ey_{i+1,j+1/2}^{n+1/2} - Ey_{i,j+1/2}^{n+1/2}\}$$

It should be noted that, in the second-half stage, the second equation (21) is an explicit expression to give the y-direction electric field component Ey, while the other equations (20) and (22) are implicit expressions. This means that an implicit method should be used to calculate the x-direction electric field component $Ex^{n+1}$ at time $(n+1)\Delta_t$, because the time derivative of Ex is approximated by backward differencing in the second-half stage of computation. Unlike this $Ex^{n+1}$, the y-direction electric field component $Ey^{n+1}$ at time $(n+1)\Delta_t$ can be obtained by using an explicit method, because the time derivative of Ey is approximated by forward differencing. Regarding the z-direction magnetic field component $Hz^{n+1}$, an implicit method should be employed to calculate its value at time $(n+1)\Delta_t$, since the time derivative of Hz is approximated by backward differencing with respect to Ex.

The equation (17) of the first-half stage computation immediately gives a value of the x-direction electric field component $Ex^{n+1/2}$ at time $(n+1/2)\Delta_t$ through a simple calculation (i.e., by addition and subtraction of known values) of electric and magnetic field values at time $_n\Delta_t$. Likewise, equation (21) of the second-half stage computation can be solved through a simple calculation. However, the equations (18) and (19) of the first-half stage cannot be solved directly, because they include electric and magnetic field terms at a future time point $(n+1/2)\Delta_t$ on their respective right-hand sides. This can be solved by eliminating the magnetic field term $Hz^{n+1/2}$, considering two equations (18) and (19) as a set of simultaneous equations. As a result, the following recurrence formula is obtained.

$$Ey^{n+1/2}_{i-1,j+1/2} - \left\{\left(\frac{2\sqrt{\varepsilon\mu}\,\Delta_x}{\Delta_t}\right)^2 + 2\right\} Ey^{n+1/2}_{i,j+1/2} + Ey^{n+1/2}_{i+1,j+1/2} = \quad (23)$$

$$-\left(\frac{2\sqrt{\varepsilon\mu}\,\Delta_x}{\Delta_t}\right)^2 Ey^n_{i,j+1/2} + \left(\frac{2\mu\Delta_x}{\Delta_t}\right)\{Hz^n_{i+1/2,j+1/2} - Hz^n_{i-1/2,j+1/2}\} +$$

$$\left(\frac{\Delta_x}{\Delta_y}\right)\{Ex^n_{i+1/2,j+1} - Ex^n_{i+1/2,j} + Ex^n_{i-1/2,j} - Ex^n_{i-1/2,j+1}\}$$

Also, in the second-half stage computation, the equations (20) and (22) cannot be directly solved, because they include electric and magnetic field terms at a future time point $(n+1)\Delta_t$ on their respective right-hand sides. Accordingly, the magnetic field term $Hz^{n+1}$ is eliminated by combining them as a set of simultaneous equations, thus yielding the following recurrence formula.

$$Ey^{n+1}_{i+1/2,j-1} - \left\{\left(\frac{2\sqrt{\varepsilon\mu}\,\Delta_y}{\Delta_t}\right)^2 + 2\right\} Ex^{n+1}_{i+1/2,j} + Ex^{n+1}_{i+1/2,j+1} = \quad (24)$$

$$-\left(\frac{2\sqrt{\varepsilon\mu}\,\Delta_y}{\Delta_t}\right)^2 Ex^{n+1/2}_{i+1/2,j} + \left(\frac{2\mu\Delta_y}{\Delta_t}\right)\{Hz^{n+1/2}_{i+1/2,j-1/2} - Hz^{n+1/2}_{i+1/2,j+1/2}\} +$$

$$\left(\frac{\Delta_y}{\Delta_x}\right)\{Ey^{n+1/2}_{i+1,j+1/2} - Ey^{n+1/2}_{i,j+1/2} + Ey^{n+1/2}_{i+1,j-1/2} - Ey^{n+1/2}_{i,j-1/2}\}$$

The above recurrence formula (23) for the first-half stage is expanded to the following set of simultaneous equations by incrementing the variable i (i.e., x-axis grid number) from 1 to imax.

$$\begin{pmatrix} b_1 & c_1 & & & & & \\ a_2 & b_2 & c_2 & & & & \\ & \ddots & \ddots & \ddots & & & \\ & & a_i & b_i & c_i & & \\ & & & \ddots & \ddots & \ddots & \\ & & & & a_{imax-1} & b_{imax-1} & c_{imax-1} \\ & & & & & a_{imax} & b_{imax} \end{pmatrix} \begin{pmatrix} Ey^{n+1/2}_1 \\ Ey^{n+1/2}_2 \\ \vdots \\ Ey^{n+1/2}_i \\ \vdots \\ Ey^{n+1/2}_{imax-1} \\ Ey^{n+1/2}_{imax} \end{pmatrix} = \quad (25)$$

$$\begin{pmatrix} D^n_1 \\ D^n_2 \\ \vdots \\ D^n_i \\ \vdots \\ D^n_{imax-1} \\ D^n_{imax} \end{pmatrix}$$

where $a_i$ is obtained as invariable part of the first term on the left-hand side of the formula (23) for i=1, 2, . . . imax; $b_i$ is obtained as invariable part of the second term on the left-hand side of the formula (23) for i=1, 2, . . . imax; $c_i$ is obtained as invariable part of the third term on the left-hand side of the formula (23) for i=1, 2, . . . imax; and $D_i^n$ represents the right-hand side of the formula (23) for i=1, 2, . . . imax. Absorbing boundary conditions are applied to two equations expressed as the first and last rows of the matrix of simultaneous equations (25).

This set of simultaneous equations (25) is referred to as a tridiagonal system of equations in terms of grid points i (1, 2, . . . imax) aligned in the x-axis direction, which can be solved with Thomas' method, for example. The numerical solution of this tridiagonal system for each value of i gives the y-direction electric field component at time $(n+1/2)\Delta_t$, at each grid point. Once the y-direction electric field values are obtained, the z-direction magnetic field components will then be determined by the equation (10).

In the same way, the recurrence formula (24) for the second-half stage is also expanded to the following set of trinomial equations in terms of j.

$$\begin{pmatrix} b_1 & c_1 & & & & & \\ a_2 & b_2 & c_2 & & & & \\ & \ddots & \ddots & \ddots & & & \\ & & a_j & b_j & c_j & & \\ & & & \ddots & \ddots & \ddots & \\ & & & & a_{jmax-1} & b_{jmax-1} & c_{jmax-1} \\ & & & & & a_{jmax} & b_{jmax} \end{pmatrix} \begin{pmatrix} Ex^{n+1}_1 \\ Ex^{n+1}_2 \\ \vdots \\ Ex^{n+1}_j \\ \vdots \\ Ex^{n+1}_{jmax-1} \\ Ex^{n+1}_{jmax} \end{pmatrix} = \quad (26)$$

$$\begin{pmatrix} D^{n+1/2}_1 \\ D^{n+1/2}_2 \\ \vdots \\ D^{n+1/2}_j \\ \vdots \\ D^{n+1/2}_{jmax-1} \\ D^{n+1/2}_{jmax} \end{pmatrix}$$

where $a_j$ is obtained as invariable part of the first term on the left-hand side of formula (24) for (j=1, 2, . . . jmax), $b_j$ is obtained as invariable part of the second term on the left-hand side of formula (24) for (j=1, 2, . . . jmax), $c_j$ is obtained as invariable part of the third term on the left-hand side of formula (24) for (j=1, 2, . . . jmax), and $D_j^{n+1/2}$ represents the right-hand side of formula (24) for (j=1, 2, . . . jmax), Absorbing boundary conditions will applied to two equations found as the first and last rows of the tridiagonal matrix of (26).

Recall the equations (18) and (20), the original form of problems for the first-half and second-half stages. The above discussion has revealed that those original problems can finally be expressed as two tridiagonal systems of equations. Therefore, the first-half stage processor 2a is designed to sequentially solve the equation (17), the tridiagonal system (25) and then the equation (19). The second-half stage processor 2b, on the other hand, is designed to sequentially solve the tridiagonal system (26), the equation (21), and then the equation (22). In the proposed ADI FD-TD method, the two processors 2a and 2b alternately perform such numerical calculations to advance the simulation time steps, thereby obtaining a solution of the two-dimensional TE wave propagation problem.

Figure 3:
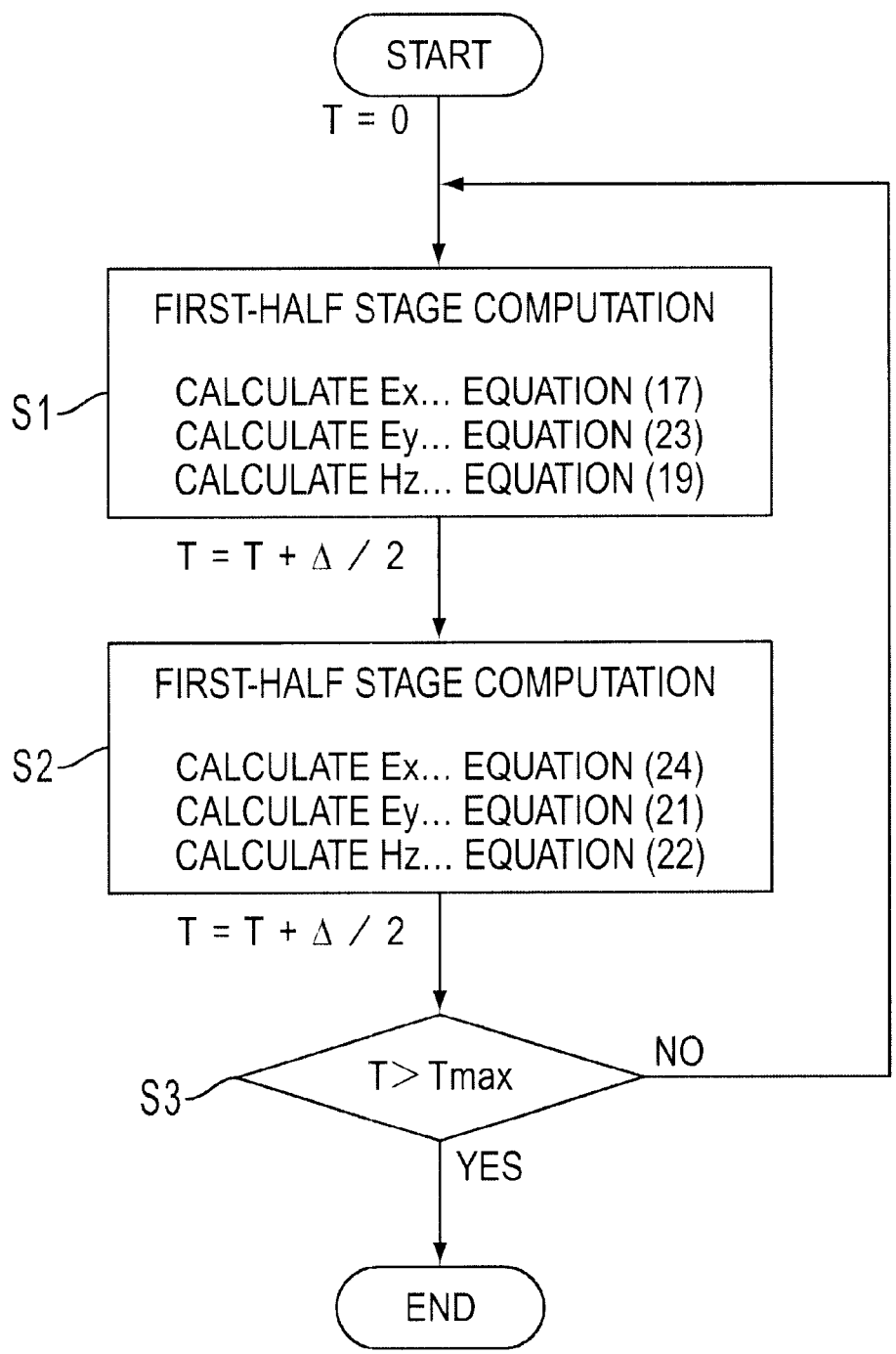
FIG. 3 is a flowchart which shows a process of analyzing a two-dimensional TE wave by using an ADI FD-TD method.

FIG. 3 is a flowchart which shows a process of analyzing a two-dimensional TE wave by using the proposed ADI FD-TD method. The details of this flowchart will be explained below, in the order of step numbers. It is assumed that all necessary initial conditions and parameters have been established for simulation, including: absorbing boundary conditions, temporal discretization interval (i.e., time step size $\Delta_t$), and spatial discretization intervals (i.e., space increments $\Delta_x$ and $\Delta_y$) The simulation time counter is reset to T=0 when starting the simulation.

(S1) The first-half stage processor 2a first calculates $Ex^{n+1/2}$ by substituting the known values of $Ex^n$ and $Hz_n$ into the equation (17). Then it solves the tridiagonal system (25) by using the known values $Ex^n$, $Ey^n$, and $Hz^n$, thereby yielding $Ey^{n+1/2}$. Now that the field values of $Ey^{n+1/2}$ are known, the first-half stage processor 2a calculates $Hz^{n+1/2}$ by solving the equation (19) with reference to the other known values of $Ex^n$ and $Hz^n$, in addition to $Ey^{n+1/2}$. The simulation time counter T is then advanced by half a time step size $\Delta_t/2$.

(S2) The second-half stage processor 2b receives the outcome of step S1, i.e., the values of $Ex^{n+1/2}$, $Ey^{n+1/2}$, and $Hz^{n+1/2}$. With those values, the second-half stage processor 2b solve the tridiagonal system (26) to calculate $Ex^{n+1}$. Then it solves the equation (21), referring to the known values $Ex^{n+1/2}$ and $Hz^{n+1/2}$. Further, by using $Ex^{n+1}$ obtained from the tridiagonal system (26), together with known values of $Ey^{n+1/2}$ and $Hz^{n+1/2}$, the second-half stage processor 2b solves the equation (22), thereby yielding $Hz^{n+1}$. The simulation time counter T is then advanced by half a time step size $\Delta_t/2$. Since it has already been advanced by $\Delta_t/2$ at step S1, the simulation time counter T now indicates a time step for the next cycle.

(S3) The analyzing unit 2 checks whether the simulation time counter T has exceeded a predefined maximum time limit Tmax. If it has exceeded Tmax, the analyzing unit 2 terminates the simulation. Otherwise, the analyzing unit 2 returns to step S1 to iterate the computation.

In the way described above, the analyzing unit 2 performs the two-dimensional TE wave analysis with the proposed ADI FD-TD method. The above discussion has assumed, for simplicity, that electromagnetic waves propagate over a lossless, isotropic, non-dispersive, homogeneous medium.

Further, it is assumed that the computational domain is divided into uniform meshes; i.e., the cell sizes $\Delta_x$ and $\Delta_y$ are equal to each other all over the domain. Under those assumptions, the coefficients $a_i$, $c_i$, $a_j$, and $c_j$ found in the tridiagonal systems (25) and (26) have unity values. In the case of inhomogeneous media or non-uniform meshes, it will be necessary to develop an extended set of formulas on the basis of the above-described equations, which can be achieved by using some techniques known in the field of conventional FD-TD applications.

The following section will now describe the numerical stability in two-dimensional TE wave analysis employing the proposed ADI FD-TD method. Below is the result of stability study using the Fourier series techniques.

It is known that the problem of numerical stability comes from truncation errors and other types of errors which are inevitably introduced during computational processes. These errors may become larger and larger as computation continues. The growth factor $\xi$ of such errors is expressed as follows.

$$\xi^{n'} = \exp\left\{\gamma\left(\frac{\Delta t}{2}\right)n'\right\} \tag{27}$$

where n' is the time step number, and $\gamma$ is a complex constant. With such growth factors, the solutions of the first-half and second-half stages are respectively expressed as follows.

$$\xi_1^{n'}\exp[\sqrt{-1}(\alpha_x+\beta_y)] \tag{28}$$

$$\xi_2^{n'}\exp[\sqrt{-1}(\alpha_x+\beta_y)] \tag{29}$$

where $\xi_1^{n'}$ and $\xi_2^{n'}$ are growth factors of such errors that would accumulate during the iterative operations in each of the first-half and second-half stages. For clarity, the square root of (−1) is used to indicate the imaginary unit, although it is normally represented by a symbol i or j, which would cause a confusion with the subscripts that have been used so far to represent grid coordinates.

From the expressions (28) and (29), the growth factors in the two individual stages are respectively expressed as:

$$\xi_1 = (1\pm\sqrt{-1}\sqrt{pq-1})/p \tag{30}$$

$$\xi_2 = (1\pm\sqrt{-1}\sqrt{pq-1})/q \tag{31}$$

where p and q are the following constants.

$$p=1+(\Delta_t^2/\epsilon\mu\Delta_x^2)\sin^2(\alpha\Delta_x/2) \tag{32}$$

$$q=1+(\Delta_t^2/\epsilon\mu\Delta_y^2)\sin^2(\beta\Delta_y/2) \tag{33}$$

Those equations (30) and (31) lead to the fact that the error growth factor $\xi$ for overall computational processes is always unity as shown below.

$$|\xi|=|\xi_1||\xi_2|=1 \tag{34}$$

This means that the numerical process is always stable and that there is no lost energy.

Figure 4:
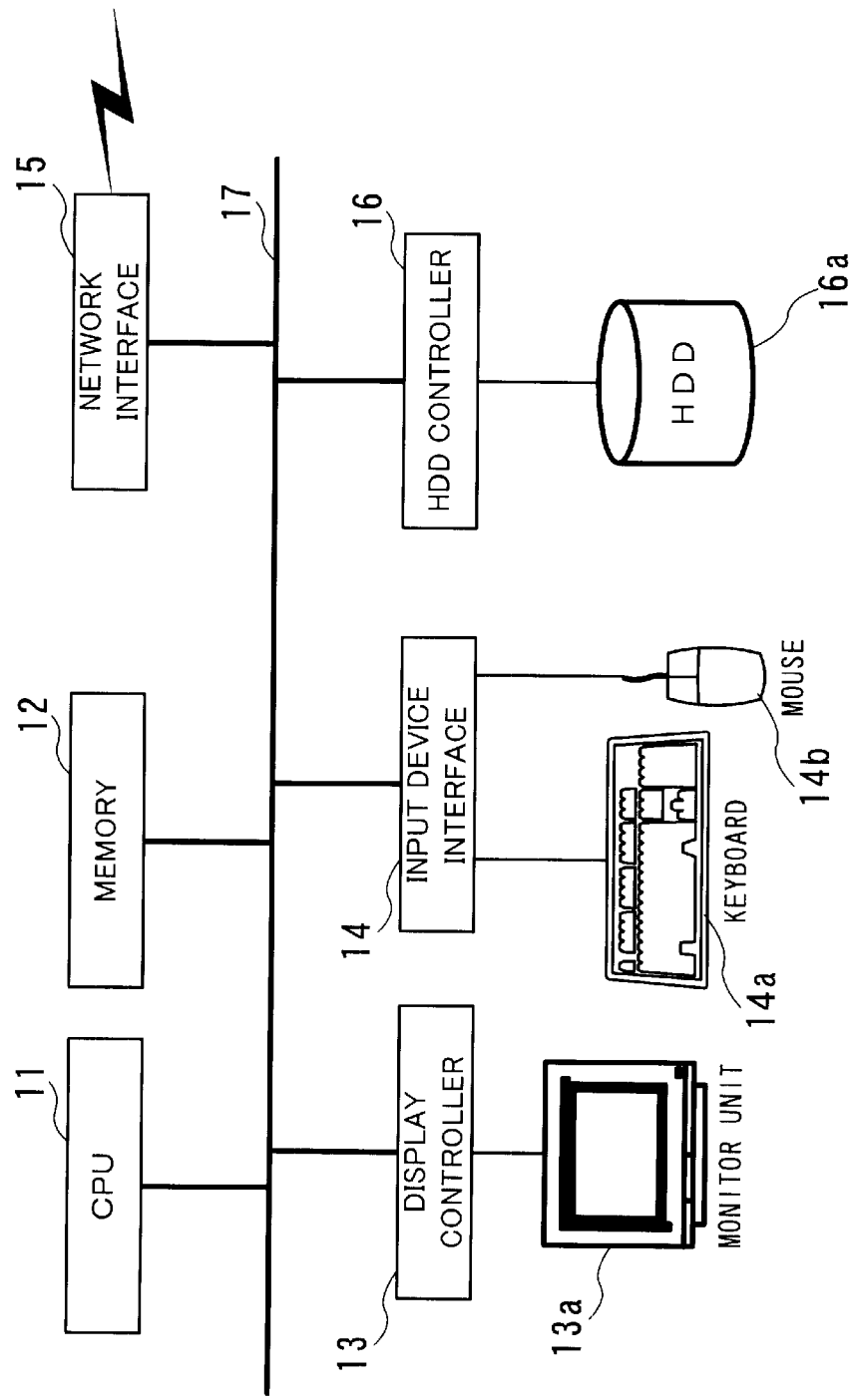
FIG. 4 is a diagram which shows a hardware configuration of an electromagnetic wave analyzer.

Referring now to FIG. 4, the following section will now describe a hardware configuration of an electromagnetic wave analyzer according to the present invention.

FIG. 4 shows a typical configuration of an electromagnetic wave analyzer, in which a computer executes programs designed for electromagnetic wave analysis. This analyzer contains a central processing unit (CPU) 11 which plays a main role in the analysis. More specifically, the CPU 11 carries out numerical computation for electromagnetic wave analysis on the basis of a software program stored in a memory 12, while controlling various peripheral devices connected through a bus 17. The peripheral devices include: a display controller 13, an input device interface 14, a network interface 15, and a hard disk drive (HDD) controller 16.

The display controller 13 produces screen images in accordance with drawing commands sent from the CPU 11 and supplies the produced image signal to a monitor unit 13a. With this signal from the display controller 13, the monitor unit 13a displays the images on its screen. The input device interface 14 is used to receive signals from a keyboard 14a and a mouse 14b. Those input signals are supplied to the CPU 11. The analyzer is linked to a local area network (LAN)through its network interface 15 for data communication. The network interface 15 controls data transmission from the CPU 11 to other equipment on the LAN, and it also transfers data received from the LAN to the CPU 11. The HDD controller 16 controls data reading and writing operations from/to an HDD 16a, which stores system programs and other pieces of program code including electromagnetic analysis software to be executed by the CPU 11.

To operate the electromagnetic wave analyzer configured as above, the user first defines initial conditions and parameters by entering necessary data through the keyboard 14a. The initial conditions and parameters include: spatial discretization intervals (cell sizes) in the x-axis and y-axis directions, temporal discretization interval (time step size), boundary conditions, definition of a computational domain. Those conditions and parameters entered by the user are passed from the input device interface 14 to the CPU 11 and written into the memory 12. When the user enters an execution start command to the analyzer, the CPU 11 receives and parses this command, and then it loads necessary programs from the HDD 16a to the memory 12 for execution of electromagnetic wave analysis. When the analysis is completed, the CPU 11 sends the results to the display controller 13 to display them on a screen of the monitor unit 13a.

A couple of specific examples of numerical analysis will be presented below. The program is configured to handle inhomogeneous media and non-uniform meshes by using conventional techniques known as part of FD-TD applications.

FIG. 5 shows a first simulation model, which represents a parallel-plate waveguide 20 having lossy dielectric films 21 and 22 in part to attenuate some frequency components. The transmissibility of electromagnetic waves across this lossy line is calculated by the proposed analyzer. Inside the waveguide structure, the lossy dielectric films 21 and 22 are located at a distance of 24 mm. Both films 21 and 22 have a narrow opening, or slit, with a width of 0.3 mm as indicated by the reference numerals 21a and 22a in FIG. 5. Other common properties of those lossy dielectric films 21 and 22 are as follows:

thickness=0.5 mm
relative permittivity $\epsilon_r$=2.0
relative permeability $\mu_r$=2.0
electric conductivity $\sigma_r$=15.0 S/m Perfect electrically conducting (PEC) boundary conditions are employed on the surfaces of an upper and lower parallel plates 23 and 24 shown in FIG. 5, while Mur's absorbing boundary conditions (ABC) are employed on both end surfaces 25 and 26 of the waveguide structure 20. Details of this Mur's absorbing boundary condition can be found in the literature, G. Mur, "Absorbing Boundary Conditions for the Finite-Difference Approximation of the Time Domain Electromagnetic Field Equations," IEEE Trans, EMC-23, 1981, pp. 377–382. Smaller cell sizes of (0.1 mm×0.1 mm) are given to the lossy dielectric films 21 and 22 and their respective slits 21a and 22a, while the other regions are divided into (1.0 mm×1.0 mm) cells, basically.

At the left-hand end surface 25 of the waveguide 20 illustrated in FIG. 5, the vertical electric field component is excited with a Gaussian pulse, and the output vertical electric field component is observed at the right-hand end surface 26. The transmission characteristics of this waveguide 20 is then calculated by adapting the Fourier transform to the excitation wave and observed wave. According to the method proposed in the present invention, the time step size $\Delta_t$ is determined under the constraints that come from the sampling theorem in relation to the Fourier transform of time-varying waveforms. Actually, $\Delta_t$ is set to 3.33 picoseconds in the present example. In contrast to this, conventional methods require the time step size $\Delta_t$ to be as short as 0.23 picoseconds, under the CFL condition for numerical stability.

Figure 6:
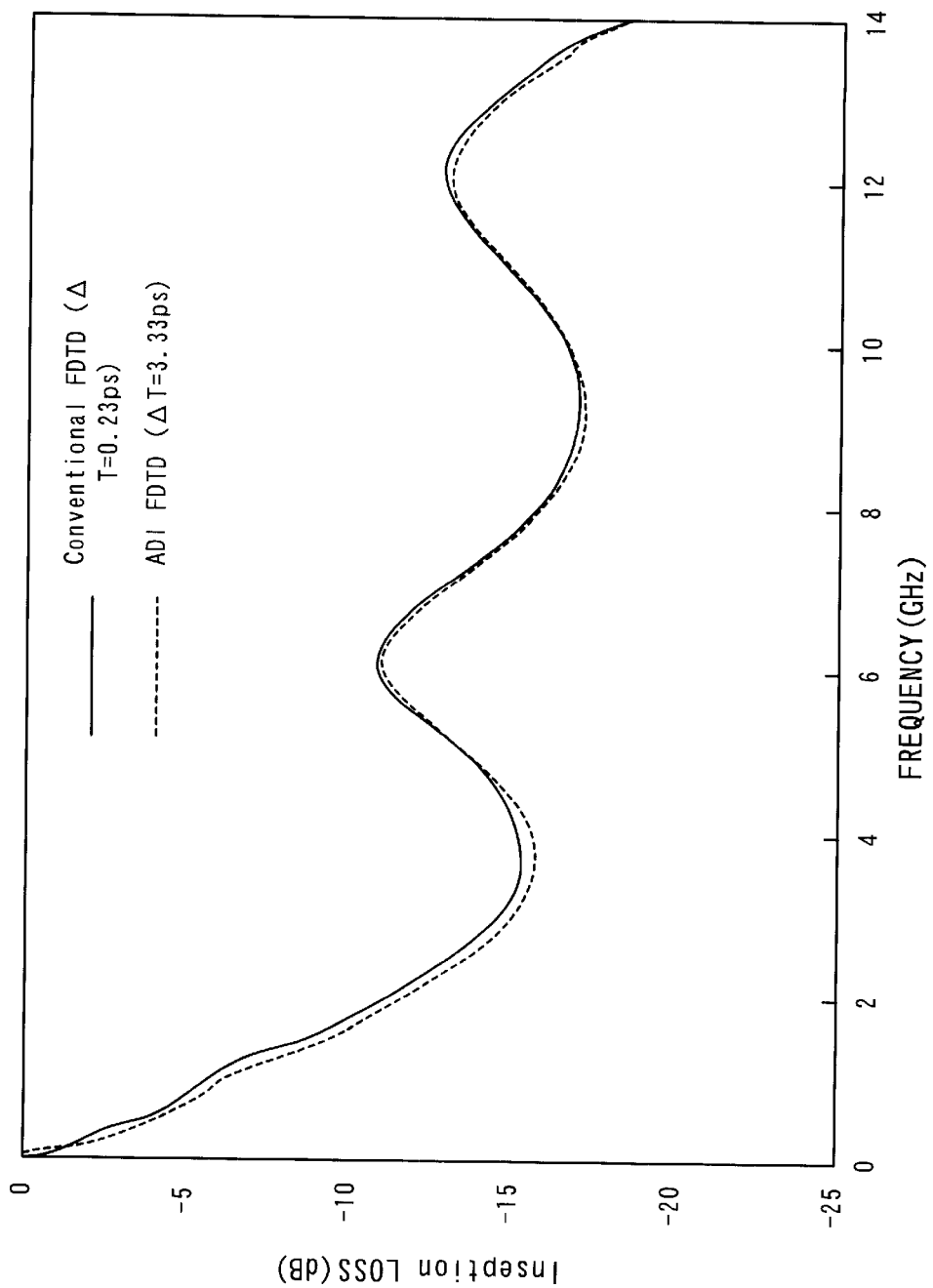
FIG. 6 is a diagram which shows numerical results obtained from the first simulation model.

FIG. 6 shows numerical results obtained from the first simulation model, in which the insertion loss (dB) is plotted on the vertical axis versus the frequencies (GHz) on the horizontal axis. As the legend shows, the broken line indicates the result of the proposed "ADI FD-TD" method, while the solid line represents the result of a "Conventional FD-TD" method. As FIG. 6 shows, those two methods exhibit a close resemblance in their numerical results.

The following table presents the comparison between the two methods in terms of computation costs.

TABLE 1

|  | $\Delta_t$ | Steps | CPU Time | Memory |
| --- | --- | --- | --- | --- |
| Conventional | 0.23 ps | 11,600 | 117.8 s | (1) |
|  | (1) | (14.5) | (3.8) |  |
| ADI FD-TD | 3.33 ps | 800 | 31.1 s | (1.3) |
|  | (14.5) | (1) | (1) |  | minimum cell size: 0.1 mm × 0.1 mm

An ordinary workstation was used to yield this data. Figures in parentheses represent the ratios between each pair of values, where the data of "Conventional FD-TD" serves as the reference for the time step size ($\Delta_t$) and memory consumption (Memory), while those of "ADI FD-TD" serve as the reference for the number of steps (Steps) and computation time (CPU Time).

The table 1 shows that the ADI FD-TD based analyzer can operate with a larger time step size by a factor of 14.5, compared to the conventional FD-TD method. This means that the number of computation steps can be reduced to 1/14.5 of that in the conventional FD-TD. As a result, the total simulation time has decreased to 1/3.8. With respect to the memory consumption, the proposed ADI FD-TD method requires 1.3 times more memory. This is because the method uses more arrays to store electric field components. The next section will present another example of FD-TD simulations conducted with even finer meshes.

Figure 7:
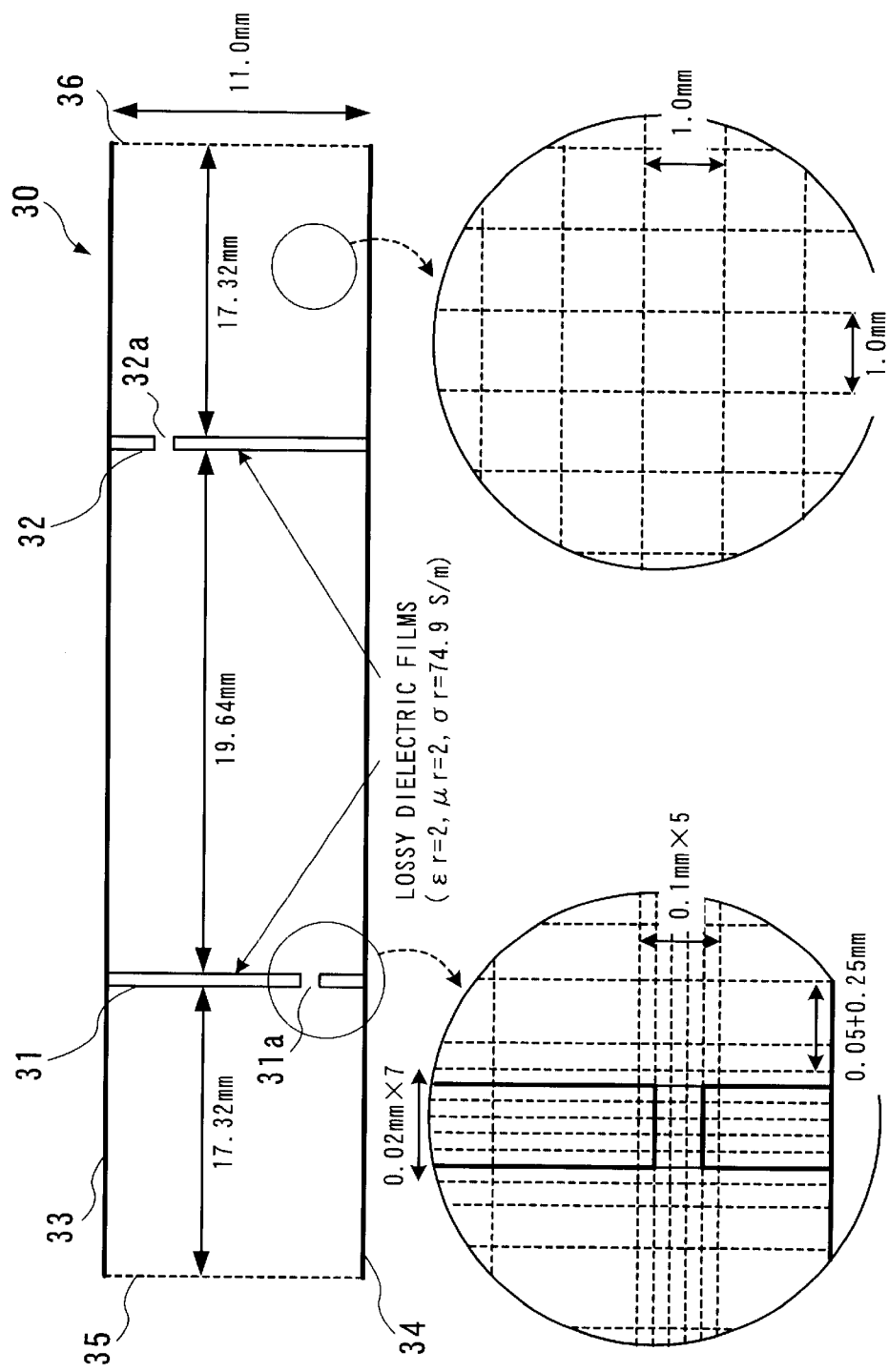
FIG. 7 is a diagram which shows a second simulation model.

FIG. 7 shows a second simulation model, which represents a parallel-plate waveguide 30. In this model, two lossy dielectric films 31 and 32 are located at a distance of 19.64 mm. The films 31 and 32 have their respective slits 31a and 32a with a width of 0.3 mm. Other properties of the lossy dielectric films 31 and 32 are as follows:

thickness=0.1 mm
relative permittivity $\epsilon_r$=2.0 relative permeability $\mu_r=2.0$ electric conductivity $\sigma_r=74.9$ S/m

Smaller cell sizes of (0.02 mm×0.1 mm) are given to the slits 21a and 22a, while the other regions are divided into (1.0 mm×1.0 mm) cells, basically. Perfect electrically conducting boundary conditions are employed on the surfaces of an upper and lower plates 33 and 34 shown in FIG. 5. Mur's absorbing boundary conditions are set on both end surfaces 35 and 36 of the waveguide 30. The same excitation condition as the first simulation model is given. The time step size $\Delta_t$ is set to 3.33 picoseconds for the ADI FD-TD method of the present invention. In contrast, $\Delta_t$ is set to 0.065 picoseconds for a normal FD-TD method to satisfy the CFL condition for numerical stability.

Figure 8:
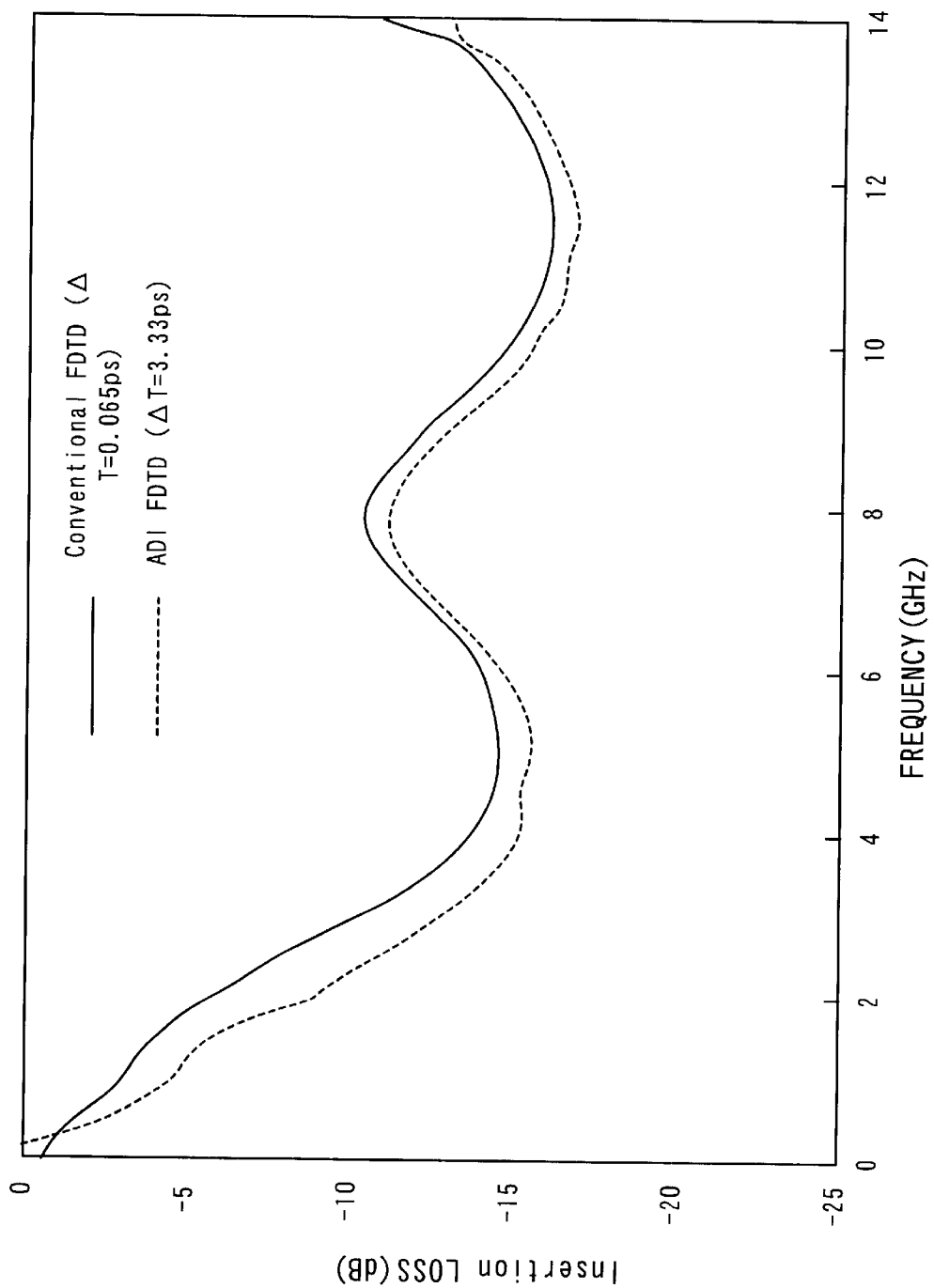
FIG. 8 is a diagram which shows numerical results obtained from the second simulation model.

FIG. 8 shows numerical results of the second simulation model. With this second simulation model, the two methods has provided quite similar patterns of frequency response, although they exhibit some quantitative differences in comparison with those in the case of the first simulation model. The following table summarizes the computation costs.

TABLE 2

|  | $\Delta_t$ | Steps | CPU Time | Memory |
|---|---|---|---|---|
| Normal FD-TD | 0.065 ps (1) | 25,550 (51.2) | 260.7 s (14.0) | (1) |
| ADI FD-TD | 3.33 ps (51.2) | 500 (1) | 18.6 s (1) | (1.3) | minimum cell size: 0.02 mm × 0.1 mm

The table 2 shows that the ADI FD-TD based analyzer can operate with a larger time step size $\Delta_t$ by a factor of 51.2, compared to the conventional FD-TD method, meaning that the number of computation steps can be reduced to 1/51.2 of that in the conventional FD-TD. As a result, the total simulation time has decreased to 1/14, although the ADI FD-TD method consumes more memory as in the first simulation model.

It should be noted that the reduction in CPU time is more distinct in the second simulation model than in the first simulation model. This suggests that the proposed ADI FD-TD method is more likely to exhibit its advantage in calculation speeds, as the cell size is reduced.

Although the above-described embodiment is targeted to two-dimensional TE wave problems, the electromagnetic wave analyzer of the present invention is not limited to this specific application, but can also be adapted to analyze the propagation of two-dimensional transverse magnetic (TM) waves or three-dimensional waves in a similar manner. Here, the term "TM wave" refers to such a wave whose magnetic field vectors are perpendicular to the direction of travel at any space point.

Consider a two-dimensional TM wave propagation problem in a region around the grid point (i, j). To solve this problem with an ADI FD-TD method, the analyzer is configured to calculate the following unknowns:

x-direction magnetic field component Hx at space point (i, j+1/2), y-direction magnetic field component Hy at space point (i+1/2, j), and z-direction electric field component Ez at space point (i, j).

According to the present invention, the propagation of a two-dimensional TM wave is formulated as described below.

In the first-half stage of computation, the following equations are used to express the state of the TM wave at time $(n+1/2)\Delta_t$.

$$Hx_{i,j+1/2}^{n+1/2} = Hx_{i,j+1/2}^{n} - \left(\frac{\Delta_t}{2\mu\Delta_y}\right)\{Ez_{i,j+1}^{n} - Ez_{i,j}^{n}\} \quad (35)$$

$$Hy_{i+1/2,j}^{n+1/2} = Hy_{i+1/2,j}^{n} + \left(\frac{\Delta_t}{2\mu\Delta_x}\right)\{Ez_{i+1,j}^{n+1/2} - Ez_{i,j}^{n+1/2}\} \quad (36)$$

$$Ez_{i,j}^{n+1/2} = \quad (37)$$
$$Ez_{i,j}^{n} + \left(\frac{\Delta_t}{2\varepsilon\Delta_x}\right)\{Hy_{i+1/2,j}^{n+1/2} - Hy_{i-1/2,j}^{n+1/2}\} - \left(\frac{\Delta_t}{2\varepsilon\Delta_y}\right)\{Hx_{i,j+1/2}^{n} - Hx_{i,j-1/2}^{n}\}$$

Then, in the second-half stage of computation, the TM wave at time $(n+1)\Delta_t$ is expressed by the following equations.

$$Hx_{i,j+1/2}^{n+1} = Hx_{i,j+1/2}^{n+1/2} + \left(\frac{\Delta_t}{2\mu\Delta_y}\right)\{Ez_{i,j+1}^{n+1} - Ez_{i,j}^{n+1}\} \quad (38)$$

$$Hy_{i+1/2,j}^{n+1} = Ey_{i+1/2,j}^{n+1/2} + \left(\frac{\Delta_t}{2\mu\Delta_x}\right)\{Ez_{i+1,j}^{n+1/2} - Ez_{i,j}^{n+1/2}\} \quad (39)$$

$$Hz_{i,j}^{n+1} = Ez_{i,j}^{n+1/2} + \left(\frac{\Delta_t}{2\varepsilon\Delta_x}\right)\{Hy_{i+1/2,j}^{n+1/2} - Hy_{i-1/2,j}^{n+1/2}\} - \quad (40)$$
$$\left(\frac{\Delta_t}{2\varepsilon\Delta_y}\right)\{Hx_{i,j+1/2}^{n+1} - Hx_{i,j-1/2}^{n+1}\}$$

The analyzer performs computation of the above first-half and second-half stages to analyze the propagation of an electromagnetic wave. More specifically, the equations (35) and (39) are solved through simple additions and subtractions of known values, and the equations (36) and (38) are each solved by calculating a tridiagonal system of equations as in the case of two-dimensional TE wave analysis. Further, the equations (37) and (40) are calculated through simple operations with reference to the results of equations (36) and (38), respectively.

Further, the proposed method can be extended to the problems of three-dimensional electromagnetic wave propagation in the following manner. Consider a three-dimensional coordinate space (x, y, z), which is divided into meshes in each axis direction and whose discrete grid points are represented as (i, j, k). Spatial discretization intervals, or cell sizes, are defined as: $\Delta_x$ in the x-direction, $\Delta_y$ in the y-direction, and $\Delta_z$ in the z-direction. The analyzer calculates the electric and magnetic fields around a specific grid point (i, j, k)

There are six unknowns as listed below:

x-direction electric field component Ex at space point (i+1/2, j, k)

y-direction electric field component Ey at space point (i, j+1/2, k)

z-direction electric field component Ez at space point (i, j, k+1/2)

x-direction magnetic field component Hx at space point (i, j+1/2, k+1/2)

y-direction magnetic field component Hy at space point (i+1/2, j, k+1/2)

z-direction magnetic field component Hz at space point (i+1/2, j+1/2, k)

Such a three-dimensional electromagnetic wave problem is formulated in the following way, since three-dimensional waves are expressed as a superposition of two-dimensional TE and TM waves.

In the first-half stage of computation, the following equations are used to express the state of the electromagnetic wave at time $(n+1/2)\Delta_t$.

$$Ex_{i+1/2,j,k}^{n+1/2} = Ex_{i+1/2,j,k}^{n} + \left(\frac{\Delta_t}{2\varepsilon\Delta_y}\right)\{Hz_{i+1/2,j+1/2,k}^{n} - Hz_{i+1/2,j-1/2,k}^{n}\} - \left(\frac{\Delta_t}{2\varepsilon\Delta_z}\right)\{Hy_{i+1/2,j,k+1/2}^{n+1/2} - Hy_{i+1/2,j,k-1/2}^{n+1/2}\} \quad (41)$$

$$Ey_{i,j+1/2,k}^{n+1/2} = Ey_{i,j+1/2,k}^{n} + \left(\frac{\Delta_t}{2\varepsilon\Delta_z}\right)\{Hx_{i,j+1/2,k+1/2}^{n} - Hx_{i,j+1/2,k-1/2}^{n}\} - \left(\frac{\Delta_t}{2\varepsilon\Delta_x}\right)\{Hz_{i+1/2,j+1/2,k}^{n+1/2} - Hz_{i-1/2,j+1/2,k}^{n+1/2}\} \quad (42)$$

$$Ez_{i,j,k+1/2}^{n+1/2} = Ez_{i,j,k+1/2}^{n} + \left(\frac{\Delta_t}{2\varepsilon\Delta_x}\right)\{Hy_{i+1/2,j,k+1/2}^{n} - Hy_{i-1/2,j,k+1/2}^{n}\} - \left(\frac{\Delta_t}{2\varepsilon\Delta_y}\right)\{Hx_{i,j+1/2,k+1/2}^{n+1/2} - Hx_{i,j-1/2,k+1/2}^{n+1/2}\} \quad (43)$$

$$Hx_{i,j+1/2,k+1/2}^{n+1/2} = Hx_{i,j+1/2,k+1/2}^{n} - \left(\frac{\Delta_t}{2\mu\Delta_y}\right)\{Ez_{i,j+1,k+1/2}^{n+1/2} - Ez_{i,j,k+1/2}^{n+1/2}\} + \left(\frac{\Delta_t}{2\mu\Delta_z}\right)\{Ey_{i,j+1/2,k+1}^{n} - Ey_{i,j+1/2,k}^{n}\} \quad (44)$$

$$Hy_{i+1/2,j,k+1/2}^{n+1/2} = Hy_{i+1/2,j,k+1/2}^{n} - \left(\frac{\Delta_t}{2\mu\Delta_z}\right)\{Ex_{i+1/2,j,k+1}^{n+1/2} - Ex_{i+1/2,j,k}^{n+1/2}\} + \left(\frac{\Delta_t}{2\mu\Delta_x}\right)\{Ez_{i+1,j,k+1/2}^{n} - Ez_{i,j,k+1/2}^{n}\} \quad (45)$$

$$Hz_{i+1/2,j+1/2,k}^{n+1/2} = Hz_{i+1/2,j+1/2,k}^{n} - \left(\frac{\Delta_t}{2\mu\Delta_x}\right)\{Ey_{i+1,j+1/2,k}^{n+1/2} - Ey_{i,j+1/2,k}^{n+1/2}\} + \left(\frac{\Delta_t}{2\mu\Delta_y}\right)\{Ex_{i+1/2,j+1,k}^{n} - Ex_{i+1/2,j,k}^{n}\} \quad (46)$$

Then, in the second-half stage of computation, the wave at time $(n+1)\Delta_t$ is expressed as follows.

$$Ex_{i+1/2,j,k}^{n+1} = \quad (47)$$
$$Ex_{i+1/2,j,k}^{n+1/2} + \left(\frac{\Delta_t}{2\varepsilon\Delta_y}\right)\{Hz_{i+1/2,j+1/2,k}^{n+1} - Hz_{i+1/2,j-1/2,k}^{n+1}\} - \left(\frac{\Delta_t}{2\varepsilon\Delta_z}\right)\{Hy_{i+1/2,j,k+1/2}^{n+1/2} - Hy_{i+1/2,j,k-1/2}^{n+1/2}\}$$

$$Ey_{i,j+1/2,k}^{n+1} = \quad (48)$$
$$Ey_{i,j+1/2,k}^{n+1/2} + \left(\frac{\Delta_t}{2\varepsilon\Delta_z}\right)\{Hx_{i,j+1/2,k+1/2}^{n+1} - Hx_{i,j+1/2,k-1/2}^{n+1}\} - \left(\frac{\Delta_t}{2\varepsilon\Delta_x}\right)\{Hz_{i+1/2,j+1/2,k}^{n+1/2} - Hz_{i-1/2,j+1/2,k}^{n+1/2}\}$$

$$Ez_{i,j,k+1/2}^{n+1} = \quad (49)$$
$$Ez_{i,j,k+1/2}^{n+1/2} + \left(\frac{\Delta_t}{2\varepsilon\Delta_x}\right)\{Hy_{i+1/2,j,k+1/2}^{n+1} - Hy_{i-1/2,j,k+1/2}^{n+1}\} - \left(\frac{\Delta_t}{2\varepsilon\Delta_y}\right)\{Hx_{i,j+1/2,k+1/2}^{n+1/2} - Hx_{i,j-1/2,k+1/2}^{n+1/2}\}$$

$$Hx_{i,j+1/2,k+1/2}^{n+1} = \quad (50)$$
$$Hx_{i,j+1/2,k+1/2}^{n+1/2} - \left(\frac{\Delta_t}{2\mu\Delta_y}\right)\{Ez_{i,j+1,k+1/2}^{n+1/2} - Ez_{i,j,k+1/2}^{n+1/2}\} + \left(\frac{\Delta_t}{2\mu\Delta_z}\right)\{Ey_{i,j+1/2,k+1}^{n+1} - Ey_{i,j+1/2,k}^{n+1}\}$$

$$Hy_{i+1/2,j,k+1/2}^{n+1} = \quad (51)$$
$$Hy_{i+1/2,j,k+1/2}^{n+1/2} - \left(\frac{\Delta_t}{2\mu\Delta_z}\right)\{Ex_{i+1/2,j,k+1}^{n+1/2} - Ex_{i+1/2,j,k}^{n+1/2}\} + \left(\frac{\Delta_t}{2\mu\Delta_x}\right)\{Ez_{i+1,j,k+1/2}^{n+1} - Ez_{i,j,k+1/2}^{n+1}\}$$

$$Hz_{i+1/2,j+1/2,k}^{n+1} = \quad (52)$$
$$Hz_{i+1/2,j+1/2,k}^{n+1/2} - \left(\frac{\Delta_t}{2\mu\Delta_x}\right)\{Ey_{i+1,j+1/2,k}^{n+1/2} - Ey_{i,j+1/2,k}^{n+1/2}\} + \left(\frac{\Delta_t}{2\mu\Delta_y}\right)\{Ex_{i+1/2,j+1,k}^{n+1} - Ex_{i+1/2,j,k}^{n+1}\}$$

For the first-half stage of computation, three recurrence formulas are derived from the following combinations of equations: (41) and 45, (42) and (46), and (43) and (44). Likewise, for the second-half stage of computation, three recurrence formulas are derived from the following combinations of equations: (47) and (52), (48) and (50), and (49) and (51). Those recurrence formulas are then rearranged to tridiagonal systems of equations, as discussed in the section of TE wave analysis. Those tridiagonal systems allow the analyzer to simulate the three-dimensional wave propagation in the same way as described earlier.

The above-described processing mechanisms are actually implemented as software functions of a computer system. Process steps of the proposed electromagnetic wave analyzer are encoded in a computer program which is stored in a computer-readable storage medium. The computer system executes those programs to provide intended functions of the present invention. The suitable computer-readable storage media include magnetic storage media and solid state memory devices. Some portable storage media, such as Compact Disc Read Only Memory (CD-ROM) and floppy disks, are also suitable for circulation purposes. Further, it will be possible to distribute the programs online to many other computers through an appropriate server computer deployed on a network. The program files delivered to the user are once installed in his/her computer's hard drive or other local mass storage devices. They are executed after being loaded to the main memory.

The above discussion will now be summarized as follows. According to the present invention, the electromagnetic wave analyzer is configured to analyze the behavior of electromagnetic waves with an alternating direction implicit FD-TD method. The proposed algorithm liberates the temporal discretization interval from dependency on the spatial discretization intervals. As a result, the analyzer can execute electromagnetic wave analysis at a higher speed and with a relatively larger time step size, even when the object model has a fine geometrical feature. The proposed method is implemented as a software program which can be stored in a computer-readable medium. This, electromagnetic wave analyzer program runs on a computer to numerically calculate the behavior of electromagnetic waves at a high speed, with an alternating direction implicit FD-TD algorithm.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An electromagnetic wave analyzer for analyzing electromagnetic wave propagation by solving Maxwell's equations in both time and spatial domains, comprising:

analysis command input means for producing a command to initiate a simulation after establishing initial conditions and parameters necessary therefor, the initial conditions and parameters including a temporal discretization interval $\Delta_t$; and analyzing means, responsive to the command from said analysis command input means, for analyzing the behavior of an electromagnetic wave with an alternating direction implicit finite-difference time-domain method which refers to a state of the electromagnetic wave at a first time point to calculate a new state of the electromagnetic wave at a second time point being $\Delta_t$ after the first time point, the temporal discretization interval $\Delta_t$ being divided into first-half and second-half stages of computation, and different sets of electromagnetic field components being computed alternately in the first-half and second-half stages.

2. The electromagnetic wave analyzer according to claim 1, wherein said analyzing means analyzes propagation of a two-dimensional TE wave.

3. The electromagnetic wave analyzer according to claim 2, wherein:
an x-y plane is defined as a plane on which electric field components of the electromagnetic wave lie;
the initial conditions and parameters established by said analysis command input means include spatial discretization intervals $\Delta_x$ and $\Delta_y$ to discretize the x-y plane in x and y directions, respectively; and
said analyzing means analyzes the electromagnetic wave around a grid point (i, j) on the x-y plane by calculating an x-direction electric field component at space point (i+1/2, j),
a y-direction electric field component at space point (i, j+1/2), and
a z-direction magnetic field component at space point (i+1/2, j+1/2) which is perpendicular to the x-y plane.

4. The electromagnetic wave analyzer according to claim 3, wherein said analyzing means comprises:
first-half stage processing means for calculating a state of the electromagnetic wave at an intermediate time point that is $\Delta_t/2$ after the first time point, based on the state of the electromagnetic wave at the first time point, by using an explicit method to calculate the x-direction electric field component, as well as an implicit method to calculate the y-direction electric field component and the z-direction magnetic field component; and
second-half stage processing means for calculating the new state of the electromagnetic wave at the second time point, based on the state of the electromagnetic wave at the intermediate time point supplied from said first-half stage processing means, by using an explicit method to calculate the y-direction electric field component, as well as an implicit method to calculate the x-direction electric field component and the z-direction magnetic field component.

5. The electromagnetic wave analyzer according to claim 4, wherein:
the first time point is the (n)th time step of the simulation;
the second time point is the (n+1)th time step of the simulation;
said first-half stage processing means calculates the state of the electromagnetic wave at the intermediate time point and at every grid point (i, j) on the x-y plane, according to the following equations $$Ex_{i+1/2,j}^{n+1/2} = Ex_{i+1/2,j}^{n} + \left(\frac{\Delta t}{2\varepsilon\Delta y}\right)\{Hz_{i+1/2,j+1/2}^{n} - Hz_{i+1/2,j-1/2}^{n}\}$$

-continued $$Ey_{i,j+1/2}^{n+1/2} = Ey_{i,j+1/2}^{n} - \left(\frac{\Delta t}{2\varepsilon\Delta x}\right)\{Hz_{i+1/2,j+1/2}^{n} - Hz_{i-1/2,j+1/2}^{n}\}$$

$$Hz_{i+1/2,j+1/2}^{n+1/2} = Hz_{i+1/2,j+1/2}^{n} + \left(\frac{\Delta t}{2\mu\Delta y}\right)\{Ex_{i+1/2,j+1}^{n} - Ex_{i+1/2,j}^{n}\} - \left(\frac{\Delta t}{2\mu\Delta x}\right)\{Ey_{i+1,j+1/2}^{n+1/2} - Ey_{i,j+1/2}^{n+1/2}\}$$

where
$Ex_{i+1/2,j}^{n}$ denotes an x-direction electric field component at the first time point and at space point (i+1/2, j),
$Ey_{i,j+1/2}^{n}$ denotes a y-direction electric field so component at the first time point and at space point (i, j+1/2),
$Hz_{i+1/2,j+1/2}^{n}$ denotes a z-direction magnetic field component at the first time point and at space point (i+1/2, j+1/2),
$Ex_{i+1/2,j}^{n+1/2}$ denotes an x-direction electric field component at the intermediate time point and at space point (i+1/2, j),
$Ey_{i,j+1/2}^{n+1/2}$ denotes a y-direction electric field component at the intermediate time point and at space point (i, j+1/2),
$Hz_{i+1/2,j+1/2}^{n+1/2}$ denotes a z-direction magnetic field component at the intermediate time point and at space point (i+1/2, j+1/2),
$\varepsilon$ is permittivity of an object being analyzed, and
$\mu$ is permeability of the object being analyzed; and
said second-half stage processing means calculates the new state of the electromagnetic wave at the second time point and at every grid point (i, j) on the x-y plane, according to the following equations $$Ex_{i+1/2,j}^{n+1} = Ex_{i+1/2,j}^{n+1/2} + \left(\frac{\Delta t}{2\varepsilon\Delta y}\right)\{Hz_{i+1/2,j+1/2}^{n+1} - Hz_{i+1/2,j-1/2}^{n+1}\}$$

$$Ey_{i,j+1/2}^{n+1} = Ey_{i,j+1/2}^{n+1/2} - \left(\frac{\Delta t}{2\varepsilon\Delta x}\right)\{Hz_{i+1/2,j+1/2}^{n+1/2} - Hz_{i-1/2,j+1/2}^{n+1/2}\}$$

$$Hz_{i+1/2,j+1/2}^{n+1} = Hz_{i+1/2,j+1/2}^{n+1/2} + \left(\frac{\Delta t}{2\mu\Delta y}\right)\{Ex_{i+1/2,j+1}^{n+1} - Ex_{i+1/2,j}^{n+1}\} - \left(\frac{\Delta t}{2\mu\Delta x}\right)\{Ey_{i+1,j+1/2}^{n+1/2} - Ey_{i,j+1/2}^{n+1/2}\}$$

where
$Ex_{i+1/2,j}^{n+1}$ denotes an z-direction electric field component at the second time point and at space point (i+1/2, j),
$Ey_{i,j+1/2}^{n+1}$ denotes a y-direction electric field component at the second time point and at space point (i, j+1/2), and
$Hz_{i+1/2,j+1/2}^{n+1}$ denotes a z-direction magnetic field component at the second time point and at space point (i+1/2, j+1/2).

6. The electromagnetic wave analyzer according to claim 1, wherein said analyzing means analyzes propagation of a two-dimensional TM wave.

7. The electromagnetic wave analyzer according to claim 6, wherein
an x-y plane is defined as a plane on which magnetic field components of the electromagnetic wave lie;
the initial conditions and parameters established by said analysis command input means include spatial discretization intervals $\Delta_x$ and $\Delta_y$ to discretize the x-y plane in x and y directions, respectively; and
said analyzing means analyzes the electromagnetic wave around a grid point (i, j) on the x-y plane by calculating an x-direction magnetic field component at space point (i, j+1/2),
a y-direction magnetic field component at space point (i+1/2, j), and
a z-direction electric field component at space point (i, j) which is perpendicular to the x-y plane.

8. The electromagnetic wave analyzer according to claim 7, wherein said analyzing means comprises:
first-half stage processing means for calculating a state of the electromagnetic wave at an intermediate time point that is $\Delta_t/2$ after the first time point, based on the state of the electromagnetic wave at the first time point, by using an explicit method to calculate the x-direction magnetic field component, as well as an implicit method to calculate the y-direction magnetic field component and the z-direction electric field component; and
second-half stage processing means for calculating the new state of the electromagnetic wave at the second time point, based on the state of the electromagnetic wave at the intermediate time point supplied from said first-half stage processing means, by using an explicit method to calculate the y-direction magnetic field component, as well as an implicit method to calculate the x-direction magnetic field component and the z-direction electric field component.

9. The electromagnetic wave analyzer according to claim 8, wherein:
the first time point is the (n)th time step of the simulation;
the second time point is the (n+1)th time step of the simulation;
said first-half stage processing means calculates the state of the electromagnetic wave at the intermediate time point and at every grid point (i, j) on the x-y plane, according to the following equations $$Hx_{i,j+1/2}^{n+1/2} = Hx_{i,j+1/2}^{n} - \left(\frac{\Delta t}{2\mu\Delta y}\right)\{Ez_{i,j+1}^{n} - Ez_{i,j}^{n}\}$$

$$Hy_{i+1/2,j}^{n+1/2} = Hy_{i+1/2,j}^{n} + \left(\frac{\Delta t}{2\mu\Delta x}\right)\{Ez_{i+1,j}^{n+1/2} - Ez_{i,j}^{n+1/2}\}$$

$$Ez_{i,j}^{n+1/2} =$$

$$Ez_{i,j}^{n} + \left(\frac{\Delta t}{2\varepsilon\Delta x}\right)\{Hy_{i+1/2,j}^{n+1/2} - Hy_{i-1/2,j}^{n+1/2}\} - \left(\frac{\Delta t}{2\varepsilon\Delta y}\right)\{Hx_{i,j+1/2}^{n} - Hx_{i,j-1/2}^{n}\}$$

where
$Hx_{i,j+1/2}^{n}$ denotes an x-direction magnetic field component at the first time point and at space point (i, j+1/2),
$Hy_{i+1/2,j}^{n}$ denotes a y-direction magnetic field component at the first time point and at space point (i+1/2, j),
$Ez_{i,j}^{n}$ denote a z-direction electric field component at the first time point and at space point (i, j),
$Hx_{i,j+1/2}^{n+1/2}$ denotes an x-direction magnetic field component at the intermediate time point and at space point (i, j+1/2),
$Hy_{i+1/2,j}^{n+1/2}$ denotes a y-direction magnetic field component at the intermediate time point and at space point (i+1/2, j),
$Ez_{i,j}^{n+1/2}$ denotes a z-direction electric field component at the intermediate time point and at space point (i, j),
$\varepsilon$ is permittivity of an object being analyzed, and
$\mu$ is permeability of the object being analyzed; and
said second-half stage processing means calculates the new state of the electromagnetic wave at the second time point and at every grid point (i, j) on the x-y plane, according to the following equations $$Hx_{i,j+1/2}^{n+1} = Hx_{i,j+1/2}^{n+1/2} + \left(\frac{\Delta t}{2\mu\Delta y}\right)\{Ez_{i,j+1}^{n+1} - Ez_{i,j}^{n+1}\}$$

$$Hy_{i+1/2,j}^{n+1} = Hy_{i+1/2,j}^{n+1/2} + \left(\frac{\Delta t}{2\mu\Delta x}\right)\{Ez_{i+1,j}^{n+1/2} - Ez_{i,j}^{n+1/2}\}$$

$$Hz_{i,j}^{n+1} =$$

$$Ez_{i,j}^{n+1/2} + \left(\frac{\Delta t}{2\varepsilon\Delta x}\right)\{Hy_{i+1/2,j}^{n+1/2} - Hy_{i-1/2,j}^{n+1/2}\} - \left(\frac{\Delta t}{2\varepsilon\Delta y}\right)\{Hx_{i,j+1/2}^{n+1} - Hx_{i,j-1/2}^{n+1}\}$$

where
$Hy_{i+1/2,j}^{n+1}$ denotes a y-direction magnetic field component at the second time point and at space point (i+1/2, j),
$Hx_{i,j+1/2}^{n+1}$ denotes an x-direction magnetic field component at the second time point and at space point (i, j+1/2), and
$Ez_{i,j}^{n+1}$ denotes a z-direction electric field component at the second time point and at space point (i, j).

10. The electromagnetic wave analyzer according to claim 1, wherein said analyzing means analyzes propagation of a three-dimensional wave.

11. The electromagnetic wave analyzer according to claim 10, wherein
said analyzing means assumes a three-dimensional space as a computational domain;
the initial conditions and parameters established by said analysis command input means include spatial discretization intervals $\Delta_x$, $\Delta_y$, and $\Delta_z$ to discretize the x-y-z space in x, y, and z directions, respectively; and
said analyzing means analyzes the electromagnetic wave around a grid point (i, j, k) in the x-y-z space by calculating
an x-direction electric field component at space point (i+1/2, j, k),
a y-direction electric field component at space point (i, j+1/2, k),
a z-direction electric field component at space point (i, j, k+1/2),
an x-direction magnetic field component at space point (i, j+1/2, k+1/2),
a y-direction magnetic field component at space point (i+1/2, j, k+1/2), and
a z-direction magnetic field component at space point (i+1/2, j+1/2, k).

12. The electromagnetic wave analyzer according to claim 11, wherein said analyzing means refers to the (n)th time step of the simulation as the first time point and the (n+1)th time step of the simulation as the second time point, and comprises:
first-half stage processing means for calculating a state of the electromagnetic wave around every grid point (i, j, k) at an intermediate time point that is $\Delta_t/2$ after the first time point, according to the following equations $$Ex_{i+1/2,j,k}^{n+1/2} = Ex_{i+1/2,j,k}^{n} + \left(\frac{\Delta t}{2\varepsilon\Delta y}\right)\{Hz_{i+1/2,j+1/2,k}^{n} - Hz_{i+1/2,j-1/2,k}^{n}\} -$$

$$\left(\frac{\Delta t}{2\varepsilon\Delta z}\right)\{Hy_{i+1/2,j,k+1/2}^{n+1/2} - Hy_{i+1/2,j,k-1/2}^{n+1/2}\}$$

$$Ey_{i,j+1/2,k}^{n+1/2} = Ey_{i,j+1/2,k}^{n} + \left(\frac{\Delta t}{2\varepsilon\Delta z}\right)\{Hx_{i,j+1/2,k+1/2}^{n} - Hx_{i,j+1/2,k-1/2}^{n}\} -$$

$$\left(\frac{\Delta t}{2\varepsilon\Delta x}\right)\{Hz_{i+1/2,j+1/2,k}^{n+1/2} - Hz_{i-1/2,j+1/2,k}^{n+1/2}\}$$

-continued $$Ez_{i,j,k+1/2}^{n+1/2} = Ez_{i,j,k+1/2}^{n} + \left(\frac{\Delta t}{2\varepsilon\Delta x}\right)\{Hy_{i+1/2,j,k+1/2}^{n} - Hy_{i-1/2,j,k+1/2}^{n}\} -$$

$$\left(\frac{\Delta t}{2\varepsilon\Delta y}\right)\{Hx_{i,j+1/2,k+1/2}^{n+1/2} - Hx_{i,j-1/2,k+1/2}^{n+1/2}\}$$

$$Hx_{i,j+1/2,k+1/2}^{n+1/2} = Hx_{i,j+1/2,k+1/2}^{n} - \left(\frac{\Delta t}{2\mu\Delta y}\right)\{Ez_{i,j+1,k+1/2}^{n+1/2} - Ez_{i,j,k+1/2}^{n+1/2}\} +$$

$$\left(\frac{\Delta t}{2\mu\Delta z}\right)\{Ey_{i,j+1/2,k+1}^{n} - Ey_{i,j+1/2,k}^{n}\}$$

$$Hy_{i+1/2,j,k+1/2}^{n+1/2} = Hy_{i+1/2,j,k+1/2}^{n} - \left(\frac{\Delta t}{2\mu\Delta z}\right)\{Ex_{i+1/2,j,k+1}^{n+1/2} - Ex_{i+1/2,j,k}^{n+1/2}\} +$$

$$\left(\frac{\Delta t}{2\mu\Delta x}\right)\{Ez_{i+1,j,k+1/2}^{n} - Ez_{i,j,k+1/2}^{n}\}$$

$$Hz_{i+1/2,j+1/2,k}^{n+1/2} = Hz_{i+1/2,j+1/2,k}^{n} - \left(\frac{\Delta t}{2\mu\Delta x}\right)\{Ey_{i+1,j+1/2,k}^{n+1/2} - Ey_{i,j+1/2,k}^{n+1/2}\} +$$

$$\left(\frac{\Delta t}{2\mu\Delta y}\right)\{Ex_{i+1/2,j+1,k}^{n} - Ex_{i+1/2,j,k}^{n}\}$$

where $Ex_{i+1/2,j,k}^{n}$ denotes an x-direction electric field component at the first time point and at space point (i+1/2, j, k), $Ey_{i,j+1/2,k}^{n}$ denotes a y-direction electric field component at the first time point and at space point (i, j+1/2, k), $Ez_{i,j,k+1/2}^{n}$ denotes a y-direction electric field component at the first time point and at space point (i, j, k+1/2), $Hx_{i,j+1/2,k+1/2}^{n}$ denotes an x-direction magnetic field component at the first time point and at space point (i, j+1/2, k+1/2), $Hy_{i+1/2,j,k+1/2}^{n}$ denotes a y-direction magnetic field component at the first time point and at space point (i+1/2, j, k+1/2), $Hz_{i+1/2,j+1/2,k}^{n}$ denotes a z-direction magnetic field component at the first time point and at space point (i+1/2, j+1/2, k), $Ex_{i+1/2,j,k}^{n}$ denotes an x-direction electric field component at the intermediate time point and at space point (i+1/2, j, k), $Ey_{i,j+1/2,k}^{n+1/2}$ denotes a y-direction electric field component at the intermediate time point and at space point (i, j+1/2, k), $Ez_{i,j,k+1/2}^{n+1/2}$ denotes a z-direction electric field component at the intermediate time point and at space point (i, j, k+1/2), $Hx_{i,j+1/2,k+1/2}^{n+1/2}$ denotes an x-direction magnetic field component at the intermediate time point and at space point (i., j+1/2, k+1/2), $Hy_{i+1/2,j,k+1/2}^{n+1/2}$ denotes a y-direction magnetic field component at the intermediate time point and at space point (i+1/2, j, k+1/2), $Hz_{i+1/2,j+1/2,k}^{n+1/2}$ denotes a z-direction magnetic field component at the intermediate time point and at space point (i+1/2, j+1/2, k), $\varepsilon$ is permittivity of an object being analyzed, and $\mu$ is permeability of the object being analyzed;

second-half stage processing means for calculating the new state of the electromagnetic wave around every grid point (i, j, k) at the second time point, according to the following equations $$Ex_{i+1/2,j,k}^{n+1} = Ex_{i+1/2,j,k}^{n+1/2} + \left(\frac{\Delta t}{2\varepsilon\Delta y}\right)\{Hz_{i+1/2,j+1/2,k}^{n+1} - Hz_{i+1/2,j-1/2,k}^{n+1}\} -$$

$$\left(\frac{\Delta t}{2\varepsilon\Delta z}\right)\{Hy_{i+1/2,j,k+1/2}^{n+1/2} - Hy_{i+1/2,j,k-1/2}^{n+1/2}\}$$

$$Ey_{i,j+1/2,k}^{n+1} = Ey_{i,j+1/2,k}^{n+1/2} + \left(\frac{\Delta t}{2\varepsilon\Delta z}\right)\{Hx_{i,j+1/2,k+1/2}^{n+1} - Hx_{i,j+1/2,k-1/2}^{n+1}\} -$$

$$\left(\frac{\Delta t}{2\varepsilon\Delta x}\right)\{Hz_{i+1/2,j+1/2,k}^{n+1/2} - Hz_{i-1/2,j+1/2,k}^{n+1/2}\}$$

$$Ez_{i,j,k+1/2}^{n+1} = Ez_{i,j,k+1/2}^{n+1/2} + \left(\frac{\Delta t}{2\varepsilon\Delta x}\right)\{Hy_{i+1/2,j,k+1/2}^{n+1} - Hy_{i-1/2,j,k+1/2}^{n+1}\} -$$

$$\left(\frac{\Delta t}{2\varepsilon\Delta y}\right)\{Hx_{i,j+1/2,k+1/2}^{n+1/2} - Hx_{i,j-1/2,k+1/2}^{n+1/2}\}$$

$$Hx_{i,j+1/2,k+1/2}^{n+1} = Hx_{i,j+1/2,k+1/2}^{n+1/2} - \left(\frac{\Delta t}{2\mu\Delta y}\right)\{Ez_{i,j+1,k+1/2}^{n+1/2} - Ez_{i,j,k+1/2}^{n+1/2}\} +$$

$$\left(\frac{\Delta t}{2\mu\Delta z}\right)\{Ey_{i,j+1/2,k+1}^{n+1} - Ey_{i,j+1/2,k}^{n+1}\}$$

$$Hy_{i+1/2,j,k+1/2}^{n+1} = Hy_{i+1/2,j,k+1/2}^{n+1/2} - \left(\frac{\Delta t}{2\mu\Delta z}\right)\{Ex_{i+1/2,j,k+1}^{n+1/2} - Ex_{i+1/2,j,k}^{n+1/2}\} +$$

$$\left(\frac{\Delta t}{2\mu\Delta x}\right)\{Ez_{i+1,j,k+1/2}^{n+1} - Ez_{i,j,k+1/2}^{n+1}\}$$

$$Hz_{i+1/2,j+1/2,k}^{n+1} = Hz_{i+1/2,j+1/2,k}^{n+1/2} - \left(\frac{\Delta t}{2\mu\Delta x}\right)\{Ey_{i+1,j+1/2,k}^{n+1/2} - Ey_{i,j+1/2,k}^{n+1/2}\} +$$

$$\left(\frac{\Delta t}{2\mu\Delta y}\right)\{Ex_{i+1/2,j+1,k}^{n+1} - Ex_{i+1/2,j,k}^{n+1}\}$$

where $Ex_{i+1/2,j,k}^{n+1}$ denotes an x,-direction electric field component at the second time point and at space point (i+1/2, j, k), $Ey_{i,j+1/2,k}^{n+1}$ denotes a y-direction electric field component at the second time point and at space point (i, j+1/2, k), $Ez_{i,j,k+1/2}^{n+1}$ denotes a z-direction electric field component at the second time point and at space point (i, j, k+1/2), $Hx_{i,j+1/2,k+1/2}^{n+1}$ denotes an x-direction magnetic field component at the second time point and at space point (i, j+1/2, k+1/2), $Hy_{i+1/2,j,k+1/2}^{n+1}$ denotes a y-direction magnetic field component at the second time point and at space point (i+1/2, j, k+1/2), and $Hz_{i+1/2,j+1/2,k}^{n+1}$ denotes a z-direction magnetic field component at the second time point and at space point (i+1/2, j+1/2, k).

13. A computer-readable medium storing a computer program for analyzing electromagnetic wave propagation by solving Maxwell's equations in both time and spatial domains, the computer program being designed to run on a computer in order to cause the computer to function as:

analysis command input means for producing a command to initiate a simulation after establishing initial conditions and parameters necessary therefor, the initial conditions and parameters including a temporal discretization interval $\Delta_t$; and analyzing means, responsive to the command from said analysis command input means, for analyzing the behavior of an electromagnetic wave with an alternating direction implicit finite-difference time-domain method which refers to a state of the electromagnetic wave at a first time point to calculate a new state of the electromagnetic wave at a second time point being $\Delta_t$ after the first time point, the temporal discretization interval $\Delta_t$ being divided into first-half and second-half stages of computation, and different sets of electromagnetic field components being computed alternately in the first-half and second-half stages.

* * * * *